United States Patent
Cho et al.

(10) Patent No.: US 11,482,587 B2
(45) Date of Patent: Oct. 25, 2022

(54) DISPLAY DEVICE INCLUDING ELECTROSTATIC DISCHARGE PROTECTION CIRCUIT

(71) Applicant: Samsung Display Co., Ltd., Yongin-Si (KR)

(72) Inventors: Seunghwan Cho, Yongin-si (KR); Minsoo Kim, Yongin-si (KR)

(73) Assignee: Samsung Display Co., Ltd.

( * ) Notice: Subject to any disclaimer, the term of this patent is extended or adjusted under 35 U.S.C. 154(b) by 162 days.

(21) Appl. No.: 16/823,220

(22) Filed: Mar. 18, 2020

(65) Prior Publication Data

US 2020/0381505 A1   Dec. 3, 2020

(30) Foreign Application Priority Data

May 27, 2019   (KR) .......................... 10-2019-0062050

(51) Int. Cl.
*H01L 27/32* (2006.01)
*H01L 23/60* (2006.01)
(Continued)

(52) U.S. Cl.
CPC .......... *H01L 27/3276* (2013.01); *H01L 23/60* (2013.01); *H01L 27/0292* (2013.01);
(Continued)

(58) Field of Classification Search
CPC ............. H01L 27/3276; H01L 27/0292; H01L 27/3248; H01L 27/3265; H01L 27/124; H01L 27/1255; H01L 23/60
See application file for complete search history.

(56) References Cited

U.S. PATENT DOCUMENTS 5,606,340 A   2/1997 Suzuki et al.
9,430,180 B2   8/2016 Hirakata et al.
(Continued)

FOREIGN PATENT DOCUMENTS

EP   3401896 A1   11/2018
JP   2015-69186 A   4/2015
(Continued)

OTHER PUBLICATIONS

European Search Report corresponding to European Patent Application No. 20176678.9 dated Aug. 5, 2020 6 pages.

*Primary Examiner* — Lex H Malsawma
(74) *Attorney, Agent, or Firm* — Innovation Counsel LLP

(57) ABSTRACT

A display device may include a substrate, a pixel, a transistor, a data line, a connection line, a pad, and an electrostatic discharge protection circuit. The substrate may include a display area and a pad area. The pad area may overlap the display area. The pixel may be supported by the display area and may include a pixel electrode. The data line may be electrically connected through the transistor to the pixel electrode. The connection line may be supported by the display area and may be electrically connected through the data line to the transistor. The pad may be supported by the pad area and may be electrically connected through the connection line to the data line. The display area and the pad area may be positioned between the connection line and the pad. The electrostatic discharge protection circuit may be electrically connected to the connection line.

20 Claims, 32 Drawing Sheets

(51) Int. Cl.
   *H01L 27/02* (2006.01)
   *H01L 27/12* (2006.01)
(52) U.S. Cl.
   CPC ...... *H01L 27/3248* (2013.01); *H01L 27/3265* (2013.01); *H01L 27/124* (2013.01); *H01L 27/1255* (2013.01)

(56) References Cited

U.S. PATENT DOCUMENTS

| | | |
|---|---|---|
| 9,535,522 B2 | 1/2017 | Ahn |
| 9,825,114 B2 | 11/2017 | Park et al. |
| 10,043,827 B2 | 8/2018 | Kwon et al. |
| 10,317,756 B2 | 6/2019 | Chong et al. |
| 2005/0230757 A1 | 10/2005 | Nagasawa et al. |
| 2008/0006858 A1* | 1/2008 | Liu .................. G02F 1/136204 257/294 |
| 2008/0123004 A1* | 5/2008 | Lin .......................... G09G 3/20 349/40 |
| 2013/0050173 A1* | 2/2013 | Koo .................. G02F 1/136204 345/212 |
| 2016/0155736 A1* | 6/2016 | Kim .................... H01L 27/1225 257/43 |
| 2017/0062408 A1* | 3/2017 | Chung ................ G09G 3/3233 |
| 2019/0319046 A1* | 10/2019 | Tominaga ............. H01L 27/124 |

FOREIGN PATENT DOCUMENTS

| | | |
|---|---|---|
| KR | 10-2016-0084006 A | 7/2016 |
| KR | 10-2017-0046683 A | 5/2017 |
| KR | 10-2018-0110317 A | 10/2018 |

\* cited by examiner

DISPLAY DEVICE INCLUDING ELECTROSTATIC DISCHARGE PROTECTION CIRCUIT

CROSS-REFERENCE TO RELATED APPLICATION

This application claims priority to and the benefit of Korean Patent Application No. 10-2019-0062050 filed on May 27, 2019 in the Korean Intellectual Property Office; the disclosure of the Korean Patent Application is incorporated herein in its entirety by reference.

BACKGROUND

1. Field

The technical field relates to a display device.

2. Description of Related Art

Display devices may present visual information. It is generally desirable for a display device to be slim, lightweight, and energy-saving. It is also generally desirable for a display device to have a minimum non-display area and a maximum display area.

SUMMARY

One or more embodiments may be related a display device with a minimum non-display area. The display device may prevent damage potentially caused by static electricity.

According to one or more embodiments, a display device includes a substrate including a display area, a peripheral area outside the display area, and a pad area within the peripheral area, a plurality of data lines arranged in the display area, and a plurality of connection lines connected to the plurality of data lines and configured to transmit signals from a plurality of pads arranged in the pad area to the plurality of data lines, wherein each of the plurality of connection lines is connected to a ESD protection circuit.

Each of the connection lines may include a plurality of sections apart from one another in an extension direction, and the ESD protection circuit may include at least one bridge configured to electrically connect a plurality of sections of the connection line to one another.

A plurality of pixels are arranged in the display area and are connected to the plurality of data lines, each of the plurality of pixels including a capacitor and a display element, and the connection lines may be arranged in a layer between the capacitor and the display element, and the data lines may be arranged in a layer between the connection lines and the capacitor.

In the display area, the bridge may be positioned on the same layer as an electrode of the display element, or on the same layer as the data lines.

Each of the connection lines may include an extension part extending from the display area to the peripheral area, and each of the connection lines may include a plurality of sections apart from one another, and the ESD protection circuit may include a bridge configured to connect a first section in the display area to a second section including the extension part, from among the plurality of sections of each of the connection lines.

A plurality of pixels may be arranged in the display area and may be connected to the plurality of data lines, each of the plurality of pixels including a capacitor and a display element, and the connection lines are arranged in a layer between the capacitor and the display element, and the data lines may be arranged in a layer between the connection lines and the capacitor.

In the display area, the bridge may be positioned on the same layer as an electrode of the display element, or on the same layer as the data lines.

According to one or more embodiments, a display device includes a substrate including a display area, a peripheral area outside the display area, and a pad area within the peripheral area, a plurality of data lines arranged in the display area, and a plurality of connection lines arranged between the plurality of data lines and a plurality of pads arranged in the pad area, wherein the plurality of connection lines include a first connection line positioned in the display area, one end of the first connection line being connected to one of the plurality of data lines, and a second connection line positioned in the peripheral area and connected to another end of the first connection line and one of the plurality of pads, and a ESD protection circuit may be connected to the first connection line or the second connection line.

A plurality of pixels may be arranged in the display area and may be connected to the plurality of data lines, each of the plurality of pixels including a capacitor and a display element, and the first connection line may be positioned in a layer between the capacitor and the display element, and the data line may be positioned in a layer between the first connection line and the capacitor.

The first connection line may include a plurality of sections apart from one another in an extension direction, and the ESD protection circuit may include at least one bridge configured to electrically connect the plurality of sections of the first connection line to one another.

In the display area, the bridge may be positioned on the same layer as an electrode of the display element.

In the display area, the bridge may be positioned on the same layer as the data lines.

The first connection line may include an extension part extending from the display area to the peripheral area, the first connection line may include a plurality of sections apart from one another, and the ESD protection circuit may include a bridge configured to connect a first section positioned in the display area to a second section including the extension part, from among a plurality of sections of the first connection line.

In the peripheral area, the bridge may be positioned on the same layer as an electrode of the display element.

In the peripheral area, the bridge may be positioned on the same layer as the data lines.

The second connection line may include a plurality of sections apart from one another in an extension direction, and the ESD protection circuit may include at least one bridge configured to electrically connect a plurality of sections of the second connection line to each other.

In the peripheral area, the at least one bridge may be positioned between the display area and the pad area.

The second connection line may be positioned on the same layer as an electrode of the capacitor, and in the peripheral area, the at least one bridge may be positioned on the same layer as one electrode of the display element.

The second connection line may be positioned on the same layer as one electrode of the capacitor, and, in the peripheral area, the at least one bridge may be positioned on the same layer as the data lines.

The display area may include a first area in which the first connection line extends in a first direction, a second area in which the first connection line extends in a second direction perpendicular to the first direction, and a third area different than the first area and the second area.

An embodiment may be related to a display device. The display device may include a substrate, a pixel, a transistor, a data line, a connection line, a pad, and an electrostatic discharge protection circuit. The substrate may include a display area and a pad area. The pad area may overlap the display area. The pixel may be supported by the display area and may include a pixel electrode. The data line may be electrically connected through the transistor to the pixel electrode. The connection line may be supported by the display area and may be electrically connected through the data line to the transistor. The pad may be supported by the pad area and may be electrically connected through the connection line to the data line. The display area and the pad area may be positioned between the connection line and the pad. The electrostatic discharge protection circuit may be electrically connected to the connection line.

The connection lines may include a first section and a second section. The electrostatic discharge protection circuit may include a bridge. The first section may be spaced from the second section an extension direction of the connection line and may be electrically connected through the bridge to the second section.

The pixel may include a capacitor. The connection line may be arranged between the capacitor and the pixel electrode. The data line may be arranged between the connection line and the capacitor.

The display device may include an insulating layer. The bridge may directly contact a surface of the insulating layer. The pixel electrode or the data line may directly contact the surface of the insulating layer.

The second section may include an extension part. The extension part may extend beyond the display area toward the pad area.

The pixel may include a capacitor. The connection line may be arranged between the capacitor and the pixel electrode. The data line may be arranged between the connection line and the capacitor.

The display device may include an insulating layer. The bridge may overlap the display area. The bridge may directly contact a surface of the insulating layer. The pixel electrode or the data line may directly contact the surface of the insulating layer.

An embodiment may be related to a display device. The display device may include the following elements: a substrate including a display area and a peripheral area, wherein the peripheral area may be positioned outside the display area and may include a pad area, and wherein the pad area may overlap the display area; a pixel supported by the display area and including a pixel electrode; a transistor; a data line electrically connected through the transistor to the pixel electrode; a first connection line supported by the display area and electrically connected through the data line to the transistor; a second connection line supported by the peripheral area and electrically connected through the first connection line to the data line; a pad supported by the pad area and electrically connected through the second connection line to the first connection line, wherein the display area and the pad area may be positioned between the first connection line and the pad; and an electrostatic discharge protection circuit electrically connected to at least one of the first connection line and the second connection line.

The pixel may include a capacitor. The first connection line may be positioned between the capacitor and the pixel electrode. The data line may be positioned between the first connection line and the capacitor.

The first connection line may include a first section and a second section. The electrostatic discharge protection circuit may include a bridge. The first section may be spaced from the second section in an extension direction of the first connection line and may be electrically connected through the bridge to the second section.

The display device may include an insulating layer. The bridge may overlap the display area. A surface of the insulating layer may directly contact each of the bridge and the pixel electrode.

The display device may include an insulating layer. The bridge may overlap the display area. A surface of the insulating layer may directly contact each of the bridge and the data line.

The first connection line may include a first section and a second section spaced from the first section. The second section may extend from the display area to the peripheral area toward the pad area. The electrostatic discharge protection circuit may include a bridge. The first section may be arranged on the display area and may be electrically connected through the bridge to the second section.

The display device may include an insulating layer. The bridge may overlap the peripheral area. A surface of the insulating layer may directly contact each of the bridge and the pixel electrode.

The display device may include an insulating layer. The bridge may overlap the peripheral area. A surface of the insulating layer may directly contact each of the bridge the data line.

The second connection line may include two sections that are spaced from one another in an

DETAILED DESCRIPTION

Figure 1:
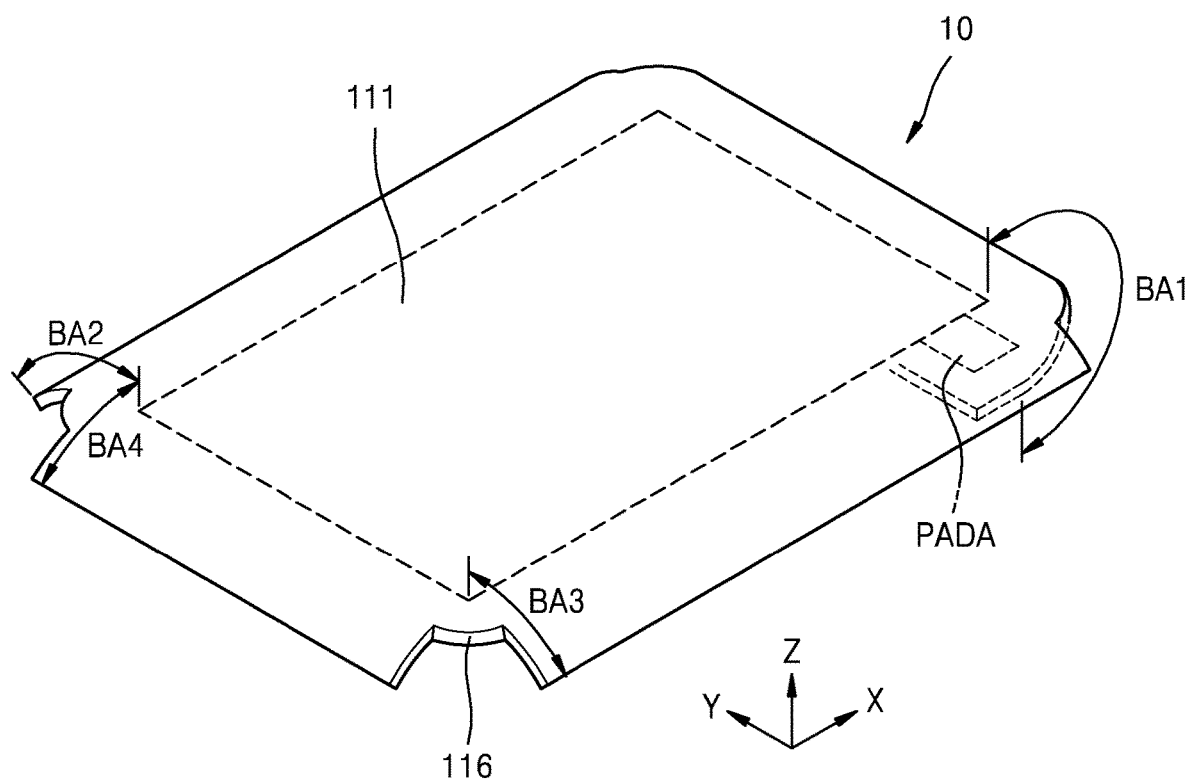
FIG. 1 is a perspective view illustrating a part of a display device according to an embodiment.

Example embodiments are described with reference to the accompanying drawings, wherein like reference numerals may refer to like elements.

Although the terms "first," "second," etc. may be used to describe various components, these components should not be limited by these terms. These terms are used to distinguish one component from another. A first component may be termed a second component without departing from teachings of one or more embodiments. The description of a component as a "first" component may not require or imply the presence of a second component or other components. The terms "first," "second," etc. may be used to differentiate different categories or sets of components. For conciseness, the terms "first," "second," etc. may represent "first-type (or first-set)," "second-type (or second-set)," etc., respectively.

The singular forms "a," "an," and "the" may include the plural forms as well, unless the context clearly indicates otherwise.

When a first element is referred to as being "on" a second element, the first element can be directly or indirectly on the second element. One or more intervening elements may be present between the first element and the second element.

Sizes of elements in the drawings may be exaggerated for convenience of explanation.

The term "connect" may mean "electrically connect." The term "positioned between" may mean "substantially positioned between." The term "positioned on the same layer" may mean "positioned on the same layer and made of the same material(s)." The term "support" may mean "mechanically support."

Figure 2:
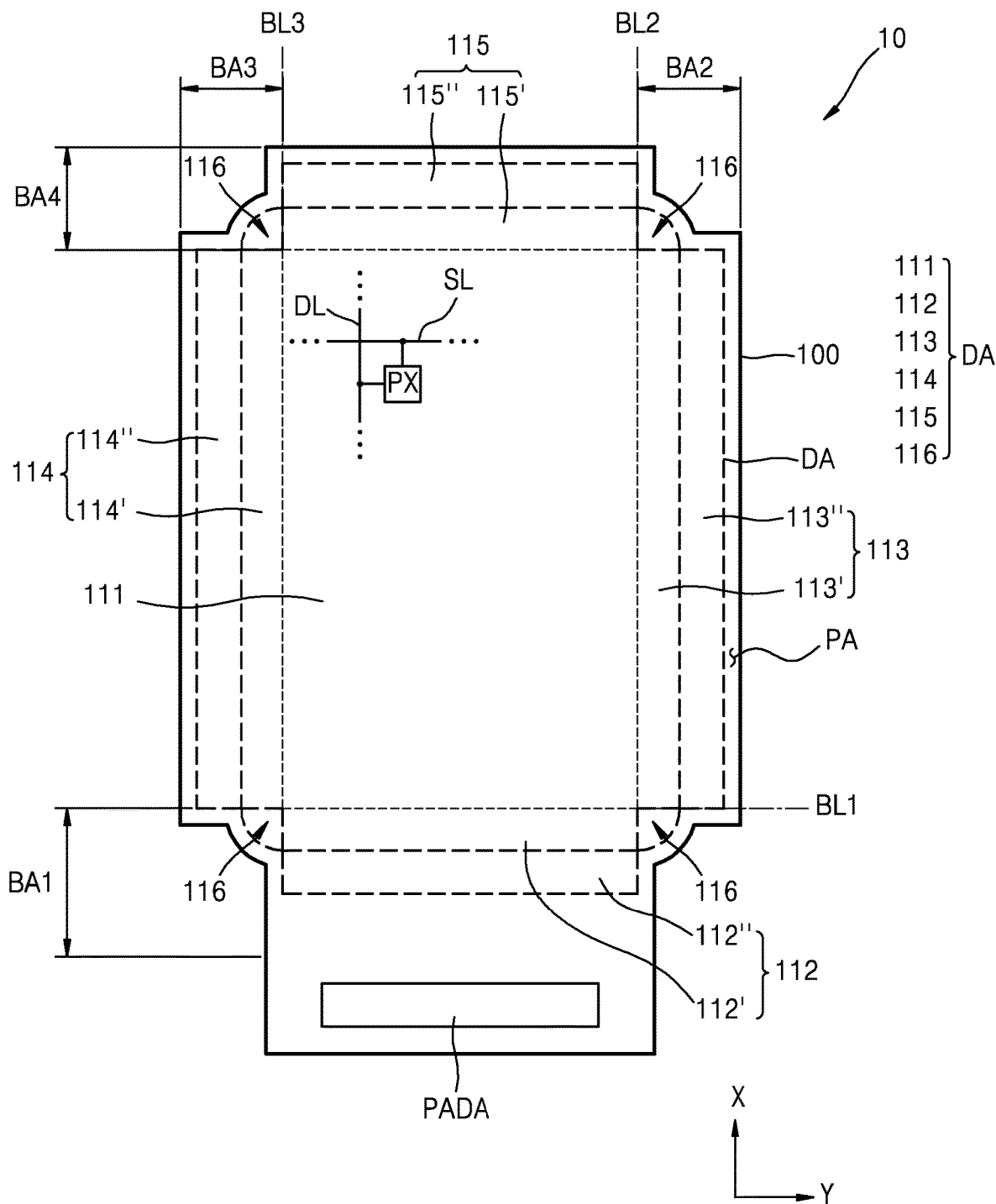
FIG. 2 is a plan view illustrating the display device of FIG. 1 according to an embodiment.
Figure 3:
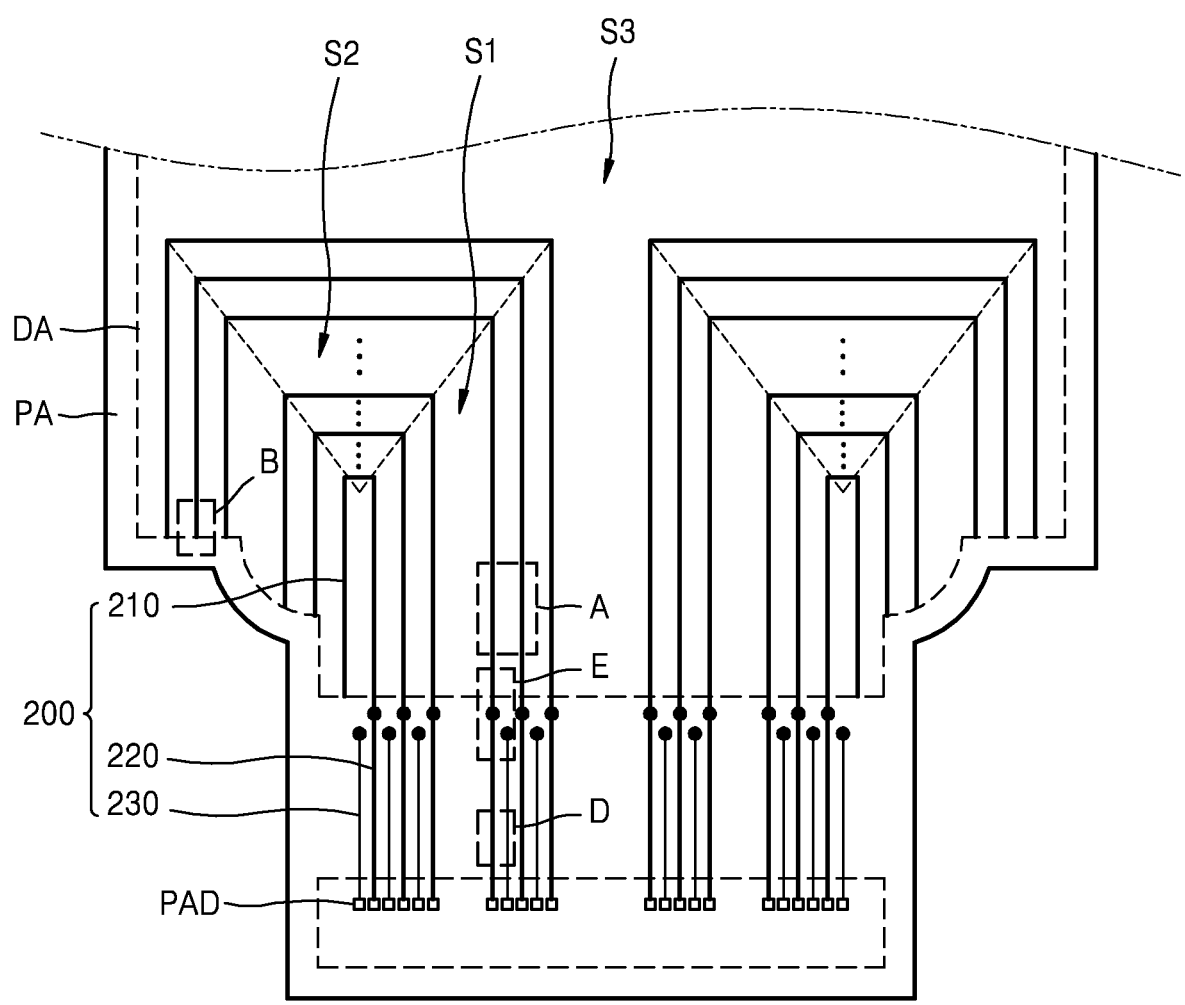
FIG. 3 is an enlarged view of a part of the display device of FIG. 2 according to an embodiment.
Figure 4:
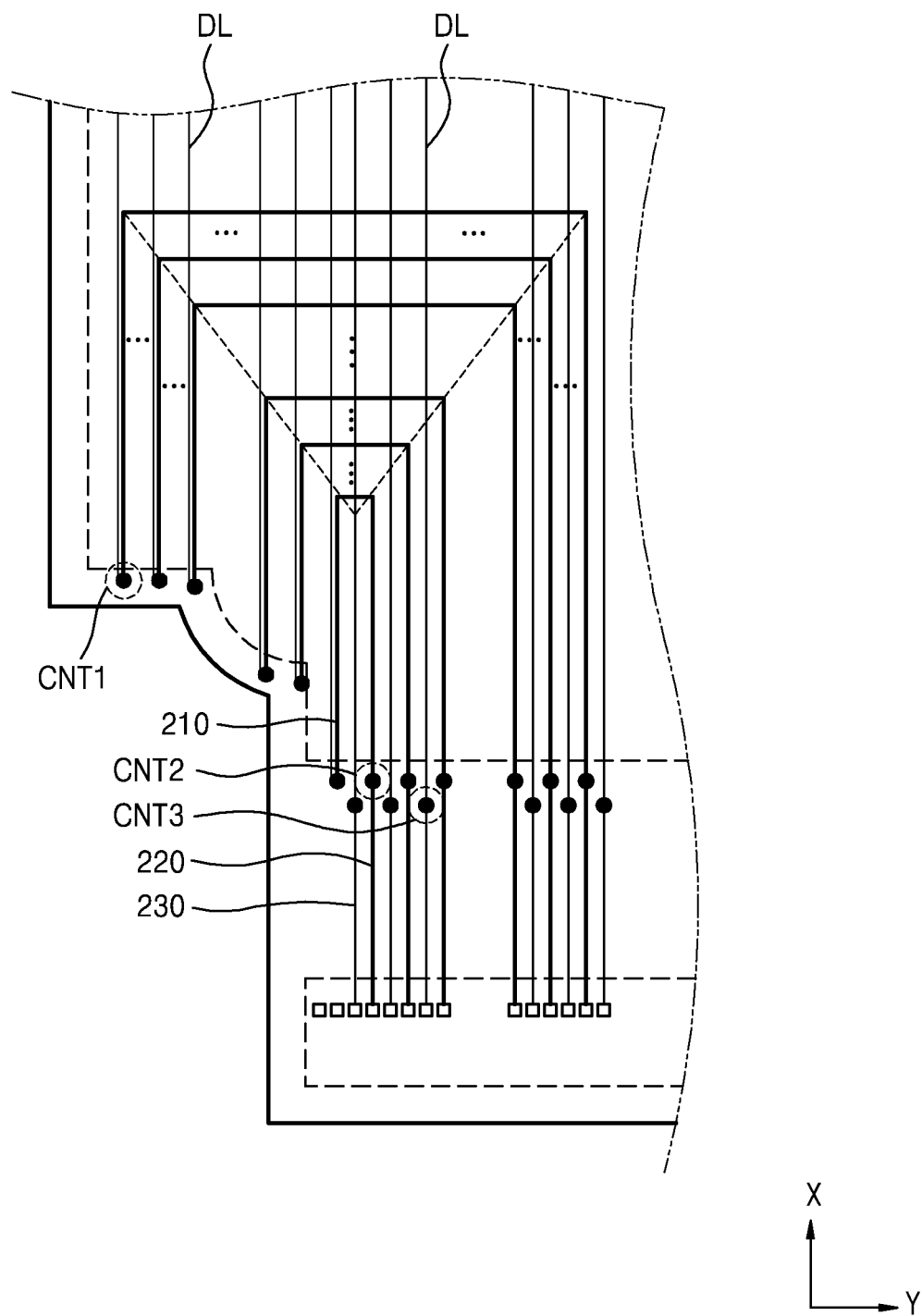
FIG. 4 is an enlarged view of a part of the display device of FIG. 2 according to an embodiment.

FIG. 1 is a perspective view illustrating a part of a display device according to an embodiment. FIG. 2 is a plan view illustrating the display device according to an embodiment. Each of FIGS. 3 and 4 is an enlarged view of a part of the display device according to an embodiment.

Referring to FIGS. 1 and 2, a display device 10 includes a display area DA for displaying an image and includes a peripheral area PA outside the display area DA. A substrate 100 of the display device 10 includes a display area and a peripheral area PA respectively corresponding to the display area DA and the peripheral area PA.

In an electronic device including the display device 10, a portion of the substrate 100 may be bent in order to minimize the area of the peripheral area PA visible to a user.

The display area DA may include a first display unit 111 and second through fifth display units 112, 113, 114, and 115 around the first display unit 111.

The first display unit 111 may be positioned in the center of the substrate 100, may be substantially flat, and may have a polygonal shape. For example, the first display unit 111 may have a rectangular shape including two sides that extend in a first direction (X-direction) and two sides that extend in a second direction (Y-direction).

The second through fifth display units 112, 113, 114, and 115 may extend from the first display unit 111. The second through fifth display units 112, 113, 114, and 115 may have curved surfaces each having a predetermined curvature radius. The second display unit 112 may be positioned in a first bending area BA1 that is bent with reference to a first bending line BL1 extending in the second direction at a first side (lower side) of the first display unit 111. The second display unit 112 may include an edge display unit 112' that is bent with a certain curvature and a side display unit 112" that is oriented substantially perpendicular to the first display unit 111. The third display unit 113 may be positioned in a second bending area BA2 that is bent with reference to a second bending line BL2 extending in the first direction at a second side (right side) of the first display unit 111. The third display unit 113 may include an edge display unit 113' that is bent with a certain curvature and a side display unit 113" that is oriented substantially perpendicular to the first display unit 111. The fourth display unit 114 may be positioned in a third bending area BA3 that is bent with reference to a third bending line BL3 extending in the first direction at a third side (left side) of the first display unit 111. The fourth display unit 114 may include an edge display unit 114' that is bent with a certain curvature and a side display unit 114" that is oriented substantially perpendicular to the first display unit 111. The fifth display unit 115 may be positioned in a fourth bending area BA4 that is bent with reference to a fourth bending line BL4 extending in the second direction at a fourth side (upper side) of the first display unit 111. The fifth display unit 115 may include an edge display unit 115' that is bent with a certain curvature and a side display unit 115" that is oriented substantially perpendicular to the first display unit 111.

The display area DA may include a round corner part 116. Round corner parts 116 may be respectively positioned between the second display unit 112 and the third display unit 113, between the third display unit 113 and the fifth display unit 115, between the second display unit 112 and the fourth display unit 114, and between the fourth display unit 114 and the fifth display unit 115.

In a front view, there is no bezel in the edge of the display device 10, and the display area DA in the front view may be maximized.

A pad area PADA may be in the peripheral area PA. The pad area PADA may accommodate electronic components and/or printed circuit boards (PCBs). For example, a driving circuit unit that supplies signals to pixels PX in the display area DA may be positioned in the pad area PADA. The driving circuit unit may include a data driving unit for applying data signals to a plurality of data lines DL. The driving circuit unit may be implemented in the form of an integrated circuit chip and may be mounted on the substrate 100. A plurality of pads PAD (see FIG. 3) may be positioned in the pad area PADA. The driving circuit unit may supply signals to the display area DA via the plurality of pads PAD. The substrate 100 may be bent in the first bending area BA1, and the driving circuit unit in the pad area PADA may overlap the display area DA. The bending direction of the pad area PADA is set so that the pad area PADA may be behind the display area DA. Thus, from the user's perspective, the display area DA takes the most part of the display device 10.

Pixels PX and wires for applying electrical signals to the pixels PX may be positioned in the display area DA. Each of the pixels PX may include a display element and a circuit unit for driving the display element. In an example, the display element may include an organic light-emitting diode, and the circuit unit may include a plurality of transistors and a capacitor.

The wires for applying electrical signals to the pixels PX may include scan lines SL and data lines DL. The scan lines SL may be arranged in rows and may transmit scan signals to the pixels PX, and the data lines DL may be arranged in columns and may transmit data signals to the pixels PX. The pixels PX may be positioned at/near intersections of the scan lines SL and the data lines DL.

Referring to FIGS. 3 and 4, connection lines 200 for transmitting electrical signals supplied from the pads PAD to wires connected to the pixels PX may be positioned on the substrate 100. For example, the connection lines 200 may be positioned (and connected) between the data lines DL and the pads PAD and may transmit data signals supplied from the pads PAD to the data lines DL.

The connection lines 200 may include a first connection line 210, a second connection line 220, and a third connection line 230. The first connection line 210 may be substantially positioned in the display area DA, and the second connection line 220 and the third connection line 230 may be positioned in the peripheral area PA. The second connection line 220 and the third connection line 230 may be positioned in the first bending area BA1.

One end of the first connection line 210 may be connected to the corresponding data line DL via a first contact part CNT1, and the other end of the first connection line 210 may be connected to the corresponding second connection line 220 via a second contact part CNT2. The first connection line 210 may extend in the first direction (+X direction), may be bent to extend in the second direction (Y direction) that is perpendicular to the first direction, and may be further bent to extend in the first direction (−X direction). One end of the second connection line 220 may be connected to the first connection line 210 via a second contact part CNT2, and the other end of the second connection line 220 may be connected to the corresponding pad PAD among the pads PAD. One end of the third connection line 230 may be connected to the corresponding data line DL via a third contact part CNT3, and the other end of the connection line 230 may be connected to the corresponding pad among the pads PAD.

First connection lines 210 and second connection lines 220 may connect data lines DL arranged in the third display unit 113 (in the second bending area BA2) and the fourth display unit 114 (in the fourth bending area BA4) to pads PAD in the pad area PADA. The second connection line 220 may be positioned in the peripheral area PA and may be indirectly connected through the first connection line 210 to the data line DL. Thus, the display area DA of the round corner part 116 between the second bending area BA2 and the first bending area BA1 and the display area DA of the round corner part 116 between the third bending area BA3 and the first bending area BA1 may not be reduced, and the peripheral area PA may not be enlarged. The non-display area may be minimized.

The display area DA may be partitioned into areas according to an extension direction of the first connection lines 210. For example, the display area DA may include a first area S1 in which (sections of) the first connection lines 210 extend in the first direction (+X direction and −X direction), a second area S2 in which (sections of) the first connection lines 210 extend in the second direction (Y direction), and a third area S3 excluding the first area S1 and the second area S2. The third area S3 may accommodate no first connection lines 210. The display device may include multiple first areas S1 and multiple second areas S2.

The peripheral area PA may surround the display area DA. The peripheral area PA may accommodate no pixels PX, may include the pad area PADA, and may accommodate voltage lines for supplying power for driving the display elements.

The connection lines 200 positioned in the peripheral area PA may be vulnerable to static electricity introduced from entities outside the display device 10. In order to prevent damage, the connection lines 200 may be connected to an electrostatic discharge (ESD) protection circuit. The ESD protection circuit may be positioned in at least one of a portion A, a portion B, a portion E, and a portion D of the display device 10 indicated in FIG. 3. The portion A may be in the display area DA. The portions B, E, and D may be in the peripheral area PA.

Figure 5A:
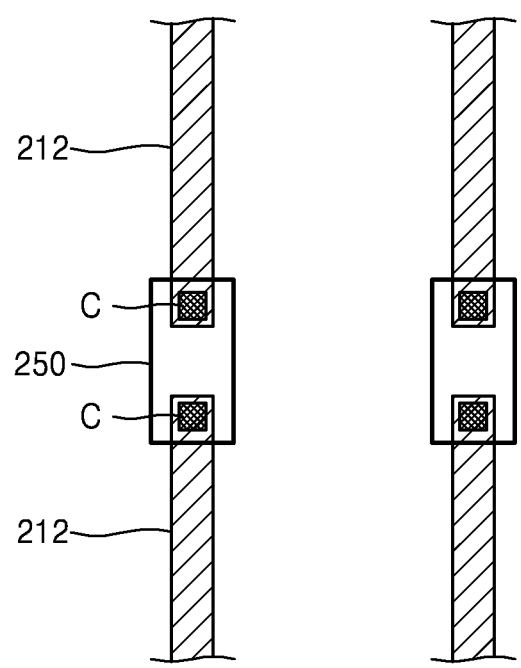
FIG. 5A is a plan view illustrating a portion A of FIG. 3 according to an embodiment.
Figure 5B:
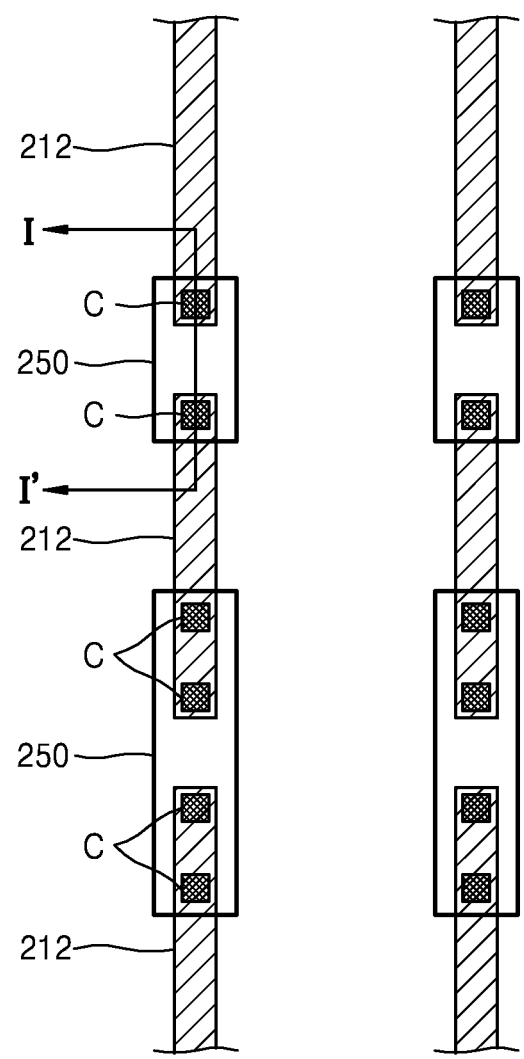
FIG. 5B is a plan view illustrating the portion A of FIG. 3 according to an embodiment.
Figure 6A:
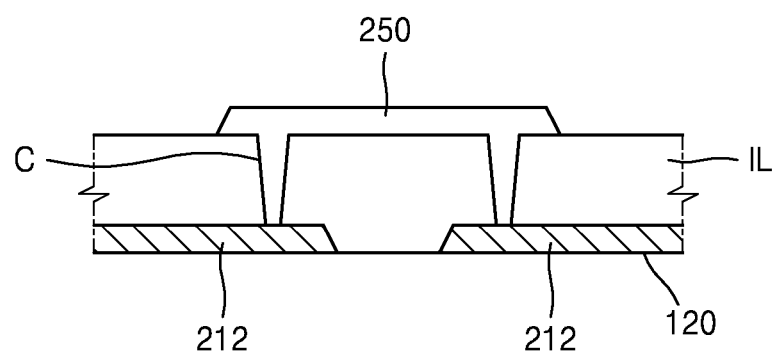
FIG. 6A is a cross-sectional view taken along a line I-I' of FIG. 5B according to an embodiment.
Figure 6B:
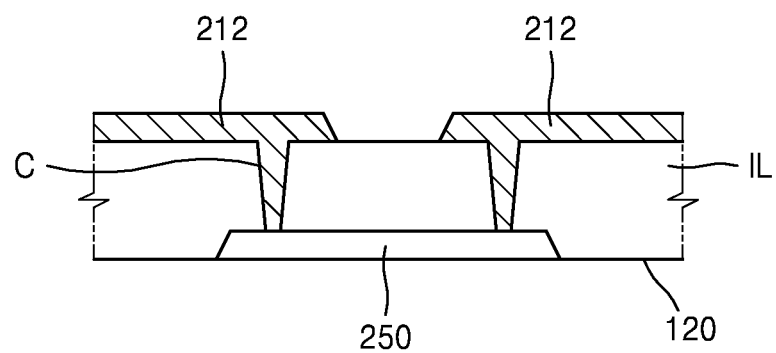
FIG. 6B is a cross-sectional view taken along the line I-I' of FIG. 5B according to an embodiment.

FIGS. 5A and 5B are plan views illustrating the portion A of FIG. 3 according to embodiments. FIGS. 6A and 6B are cross-sectional views taken along a line I-I' of FIG. 5B according to embodiments.

In an embodiment, ESD protection circuits may be positioned in the first area S1 of the display area DA. Referring to FIGS. 3, 4, 5A, and 5B, in the first area S1, a first connection line 210 may extend in the first direction and may include sections 212 that are spaced from one another in the first direction. The first connection line 210 may be connected to the corresponding ESD protection circuit. The ESD protection circuit may include a bridge 250 that electrically connects the sections 212. The number of the sections 212 and the number of the bridges 250 may be configured according to lengths of the first connection lines 210. FIG. 5A illustrates one bridge 250 that connects two sections 212 of each of the first connection lines 210, and FIG. 5B illustrates two bridges 250 that connect three sections 212 of each of the first connection lines 210. The number of contact holes C in which the bridges 250 connect the sections 212 may be configured according to embodiments.

Referring to FIGS. 6A and 6B, a bridge 250 may be arranged on a layer different from a layer on which sections 212 are positioned, and may be electrically connected to the sections 212 via contact holes C.

As shown in FIG. 6A, a bridge 250 may overlap sections 212 of a first connection line 210 with at least one intervening insulating layer IL. The first connection line 210 may be positioned on an insulation surface 120 and may be positioned between the insulation surface 120 and the bridge 250. The insulation surface 120 may be a top surface of an insulating layer between the substrate 100 and the first connection lines 210.

As shown in FIG. 6B, a bridge 250 may be positioned between an insulation surface 120 and each of two sections 212 of a first connection lines 210. At least one insulating layer IL may be positioned between the bridge 250 and each of the sections 212. The bridge 250 may be positioned on the insulation surface 120. The insulation surface 120 may be a top surface of an insulating layer between the substrate 100 and the bridges 250.

Figure 7:
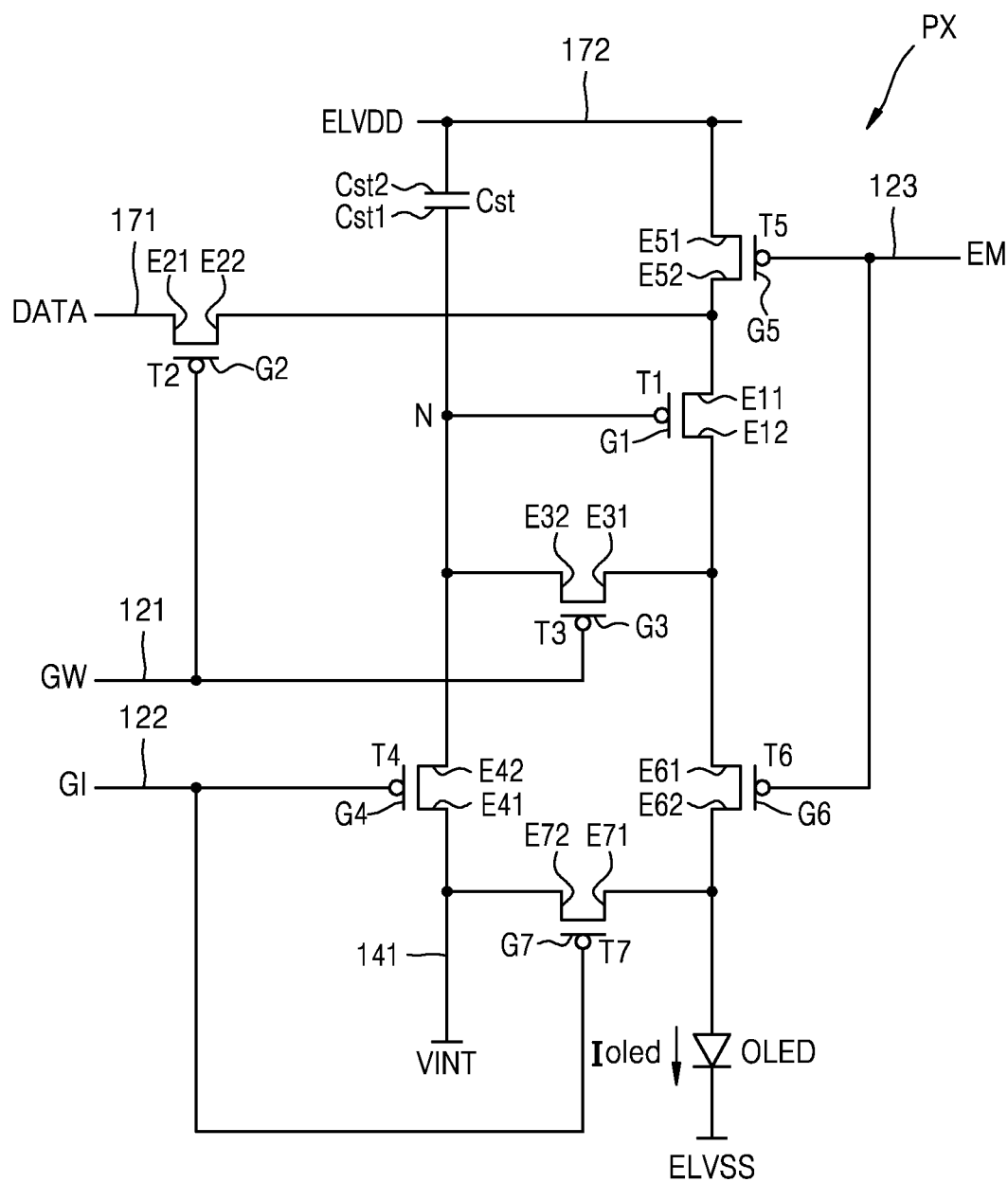
FIG. 7 is an equivalent circuit diagram of a pixel shown in FIG. 2 according to an embodiment.

FIG. 7 is an equivalent circuit diagram of pixels shown in FIG. 2 according to an embodiment.

Referring to FIG. 7, pixels PX include a display element and a pixel circuit for driving the display element by receiving signals from the wires. Hereinafter, pixels PX in which an OLED is used as a display element, will be described as an example.

FIG. 7 illustrates the case where signal lines 121, 122, 123, and 171, an initialization voltage line 141 and a power supply voltage line 172 are provided in each pixel PX. In another embodiment, at least one of the signal lines 121, 122, 123, and 171, the initialization voltage line 141 or/and the power supply voltage line 172 may be shared in neighboring pixels.

The signal lines 121, 122, 123, and 171 include a first scan line 121 for transmitting a first scan signal GW, a second scan line 122 for transmitting a second scan signal GI, an emission control line 123 for transmitting an emission control signal EM, and a data line 171 that crosses the first scan line 121 and transmits a data signal DATA. The second scan line 122 may be connected to the first scan line 121 in the next row or the previous row, and the second scan signal GI may be the first scan signal GW in the next row or the previous row.

The power supply voltage line 172 may transmit a first power supply voltage ELVDD to a first transistor T1, and the initialization voltage line 141 may transmit an initialization voltage VINT for initializing the first transistor T1 and a pixel electrode to each pixel PX.

The pixel circuit of each pixel PX may include transistors T1 through T7 and a capacitor Cst. First electrodes E11 through E71 and second electrodes E12 through E72 of FIG. 7 may be source electrodes (source regions) or drain electrodes (drain regions) according to the type (p-type or n-type) of a transistor and operation conditions thereof. The first through seventh transistors T1 through T7 may be thin-film transistors (TFTs).

A first transistor T1 may include a gate electrode G1 connected to a first electrode Cst1 of the capacitor Cst, a first electrode E11 connected to the power supply voltage line 172 via a fifth transistor T5, and a second electrode E12 electrically connected to a pixel electrode of the OLED via a sixth transistor T6. The first transistor T1 serves as a driving transistor and supplies a current to the OLED by receiving a data signal DATA according to a switching operation of the second transistor T2.

The second transistor T2 may include a gate electrode G2 connected to the first scan line 121, a first electrode E21 connected to the data line 171, and a second electrode E22 connected to the first electrode E11 of the first transistor T1. The second transistor T2 may be turned on according to the first scan signal GW received via the first scan line 121 and may perform a switching operation of transmitting the data signal DATA transmitted to the data line 171 to the first electrode E11 of the first transistor T1.

The third transistor T3 may include a gate electrode G3 connected to the first scan line 121, a first electrode E31 connected to the second electrode E12 of the first transistor T1, and a second electrode E32 connected to the first electrode Cst1 of the capacitor Cst, a second electrode E42 of the fourth transistor T4, and the gate electrode G1 of the first transistor T1. The first electrode E31 is connected to the pixel electrode of the OLED via a sixth transistor T6. The third transistor T3 may be turned on according to the first scan signal GW received via the first scan line 121, thereby diode-connecting the first transistor T1.

The fourth transistor T4 may include a gate electrode G4 connected to the second scan line 122, a first electrode E41 connected to the initialization voltage line 141, and a second electrode E42 connected to the first electrode Cst1 of the capacitor Cst, the second electrode E32 of the third transistor T3, and the gate electrode G1 of the first transistor T1. The fourth transistor T4 may be turned on according to the second scan signal GI received via the second scan line 122 and may transmit the initialization voltage VINT to the gate electrode G1 of the first transistor T1, thereby initializing a gate voltage of the first transistor T1.

The fifth transistor T5 may include a gate electrode G5 connected to the emission control line 123, a first electrode E51 connected to the power supply voltage line 172, and a second electrode E52 connected to the first electrode E11 of the first transistor T1 and the second electrode E22 of the second transistor T2.

The sixth transistor T6 may include a gate electrode G6 connected to the emission control line 123, a first electrode E61 connected to the second electrode E12 of the first transistor T1 and the first electrode E31 of the third transistor T3, and a second electrode E62 connected to the pixel electrode of the OLED.

The fifth transistor T5 and the sixth transistor T6 may be turned simultaneously according to the emission control signal EM transmitted via the emission control line 123 and thus, a current may flow through the OLED.

The seventh transistor T7 may include a gate electrode G7 connected to the second scan line 122, a first electrode E71 connected to the second electrode E62 of the sixth transistor T6 and the pixel electrode of the OLED, and a second electrode E72 connected to the initialization voltage line 141. The seventh transistor T7 may be turned on according to the second scan signal GI transmitted via the second scan line 122 so as to initialize a voltage of the pixel electrode of the OLED. The seventh transistor T7 may be omitted.

In FIG. 7, the fourth transistor T4 and the seventh transistor T7 are connected to the second scan line 122. In an embodiment, the fourth transistor T4 may be connected to the second scan line 122, and the seventh transistor T7 may be connected to an additional wiring and thus may be driven according to a signal to be transmitted to the wiring.

The capacitor Cst may include a first electrode Cst1 connected to the gate electrode G1 of the first transistor T1 and a second electrode Cst2 connected to the power supply voltage line 172. The first electrode Cst1 of the capacitor Cst may be connected to the second electrode E32 of the third transistor T3 and the second electrode E42 of the fourth transistor T4.

The OLED may include a pixel electrode and a common electrode that faces the pixel electrode. A second power supply voltage ELVSS may be applied to the common electrode. The OLED may emit light by receiving the current Ioled from the first transistor T1, thereby displaying an image.

Figure 8:
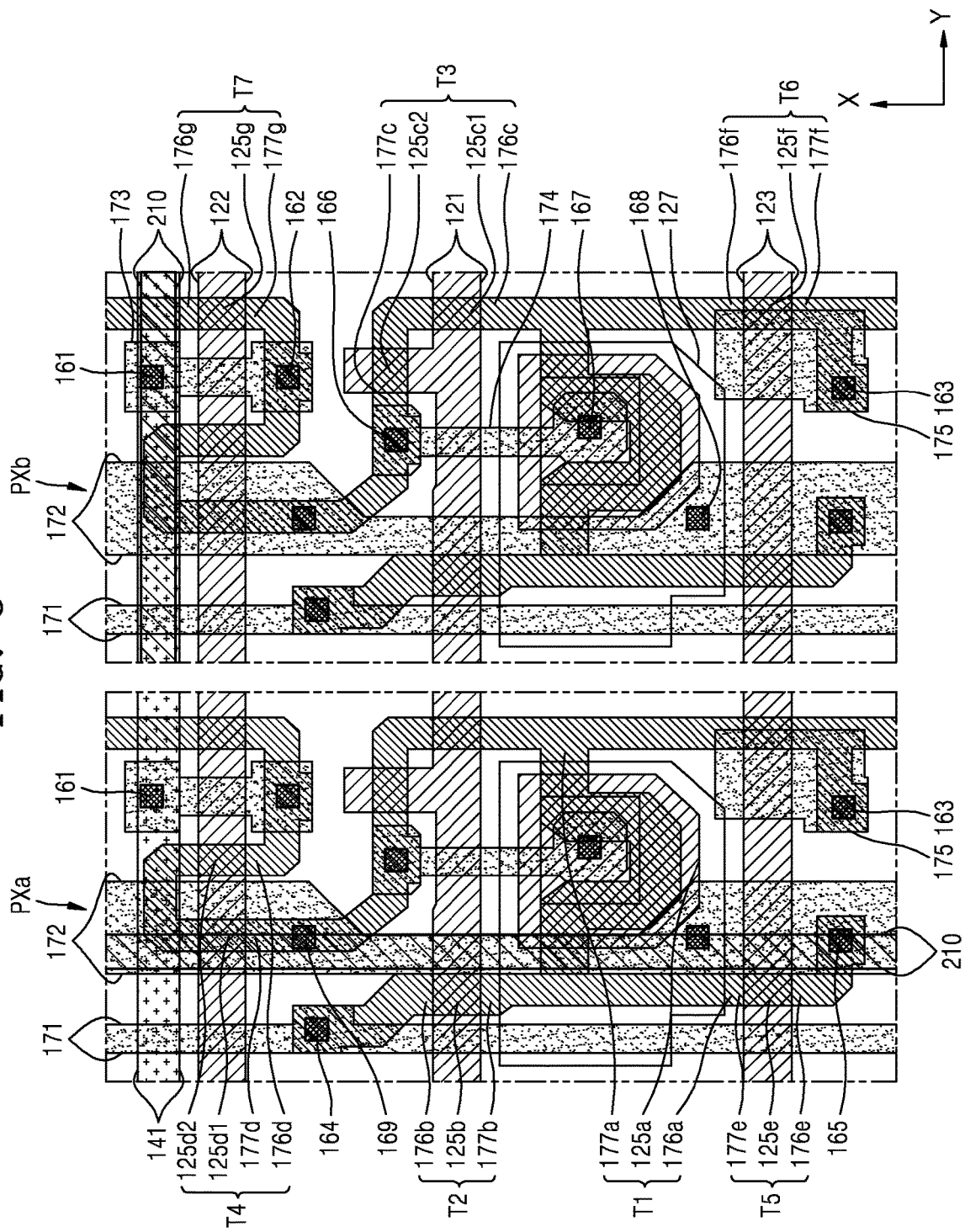
FIG. 8 is a layout diagram illustrating pixels of the display device according to an embodiment.

FIG. 8 is a layout diagram illustrating pixels of the display device 10 according to an embodiment. The transistors illustrated in FIG. 8 may be TFTs and may be analogous to the transistors described with reference to FIG. 7.

FIG. 8 illustrates a pixel PXa in the first area S1 of FIG. 3 and a pixel PXb in the second area S2 of FIG. 3.

The pixel PXa and the pixel PXb may include wires that extend in the first direction (X-direction) and wires that extend in the second direction (Y-direction). The first scan line 121, the second scan line 122, the emission control line 123, and the initialization voltage line 141 may extend in the second direction. The data line 171 and the power supply voltage line 172 may extend in the first direction.

Each of the pixel PXa and the pixel PXb may include first through seventh TFTs T1 through T7 and may include a capacitor Cst. Each of the first through seventh TFTs T1 through T7 may include a semiconductor layer including a source region, a drain region, and a channel region between the source region and the drain region, and a gate electrode positioned to correspond to the channel region and being insulated from the semiconductor layer Each of the first electrode and the second electrode of each of the transistors of FIG. 7 may be a source electrode (source region) or a drain electrode (drain region).

A first connection line 210 section that extends in the first direction (X-direction) may be positioned in the pixel PXa in the first area S1. A first connection line 210 section that extends in the second direction (Y-direction) may be positioned in the pixel PXb in the second area S2. The first connection line 210 may be positioned in an upper layer of the data line 171 and the power supply voltage line 172. The first connection line 210 may be positioned in a layer between the data line 171, the power supply voltage line 172, and the pixel electrode.

Figure 9:
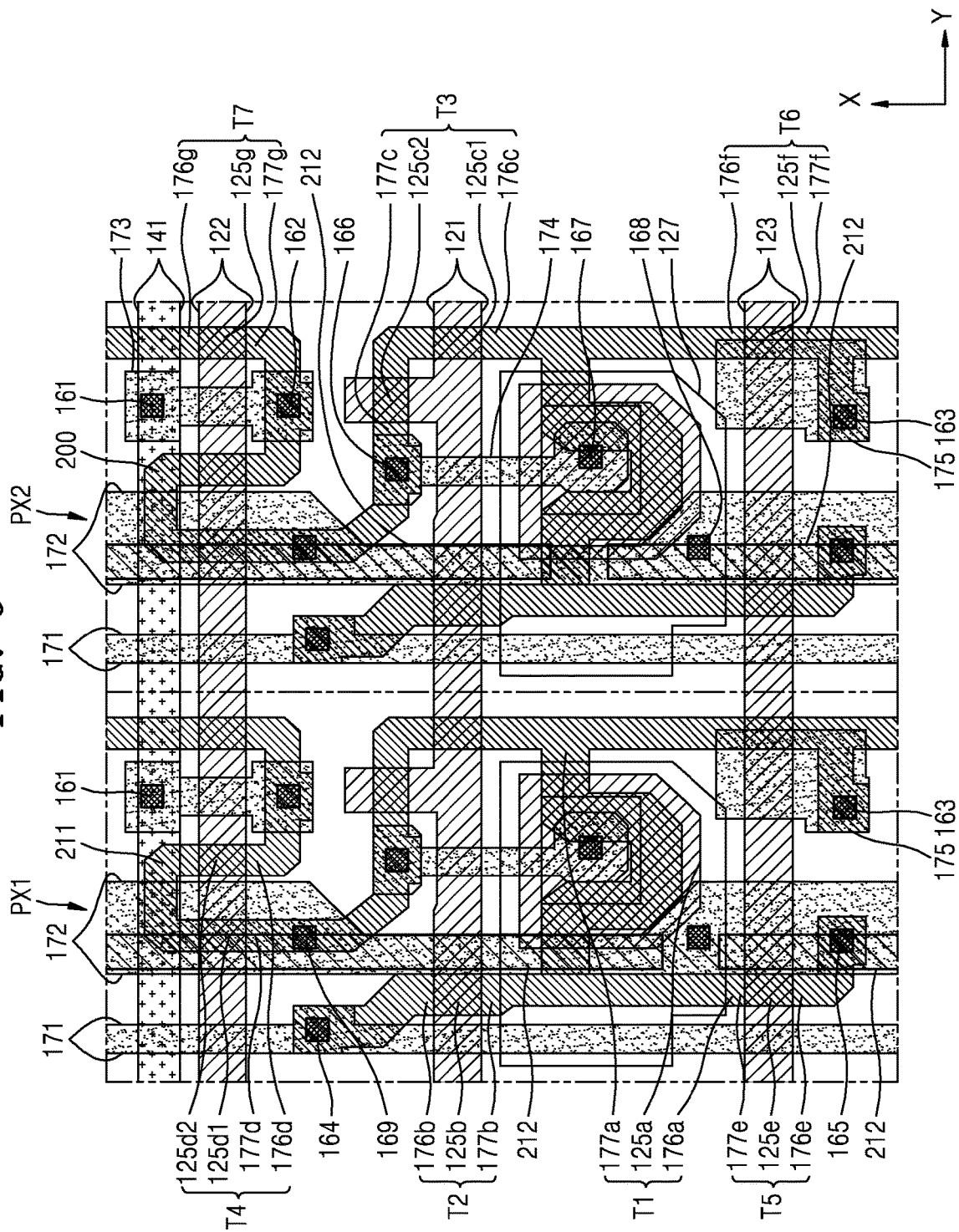
FIG. 9 is a layout diagram illustrating pixels according to an embodiment.

FIG. 9 is a layout diagram illustrating pixels according to an embodiment. FIGS. 10 through 16 are layout diagrams illustrating elements of the pixels of FIG. 9 in different layers according to one or more embodiments. FIG. 17 is a cross-sectional view illustrating a part of the display device of FIG. 2. FIG. 17 illustrates a cross-section taken along a line II-II' that passes through a pixel electrode of FIG. 15.

FIG. 9 illustrates a first pixel PX1 and a second pixel PX2 that are in or adjacent to the first area S1 of FIG. 3. The first pixel PX1 and the second pixel PX2 are a pair of pixels arranged in the same row of adjacent columns. Structures of the first pixel PX1 may be analogous to structures of the second pixel PX2. Structures of the first pixel PX1 are described with reference to FIGS. 10 through 17.

As shown in FIG. 17, a display device (e.g., the display device 10) includes a substrate 100.

The substrate 100 may include one or more flexible or bendable materials. For example, the substrate 100 may include polymer resin, such as polyethersulphone (PES), polyacrylate, polyetherimide (PEI), polyethylene naphthalate, (PEN), polyethylene terephthalate (PET), polyphenylene sulfide (PPS), polyarylate (PAR), polyimide (PI), polycarbonate (PC), or cellulose acetate propionate (CAP).

The substrate 100 may have a multi-layer structure including two polymer resin layers and may include an inorganic material layer (such as a silicon oxide, silicon nitride, or silicon oxynitride layer) positioned between the two polymer resin layers.

The first pixel PX1 and the second pixel PX2 may be positioned on the substrate 100. A buffer layer 101 may be positioned on the substrate 100 as necessary. The buffer layer 101 may planarize a surface of the substrate 100 or may prevent an impurity from penetrating into the semiconductor layer on the substrate 100. The buffer layer 101 may have a single layer/multi-layer structure including an inorganic insulating material, such as a silicon oxide, a silicon nitride, or a silicon oxynitride. The buffer layer 101 may be omitted.

The semiconductor layer may be positioned on the buffer layer 101. The semiconductor layer may have various curved shapes, as shown in FIG. 9. Each of the first pixel PX1 and the second pixel PX2 may include a semiconductor layer having the same shape. Hereinafter, when each layer of the first pixel PX1 and the second pixel PX2 has the same shape, this will not be described with discrimination. The semiconductor layer of each of the first through seventh TFTs T1 through T7 may include a channel region, a source region and a drain region, wherein the channel region is between the source region and the drain region.

Figure 10:
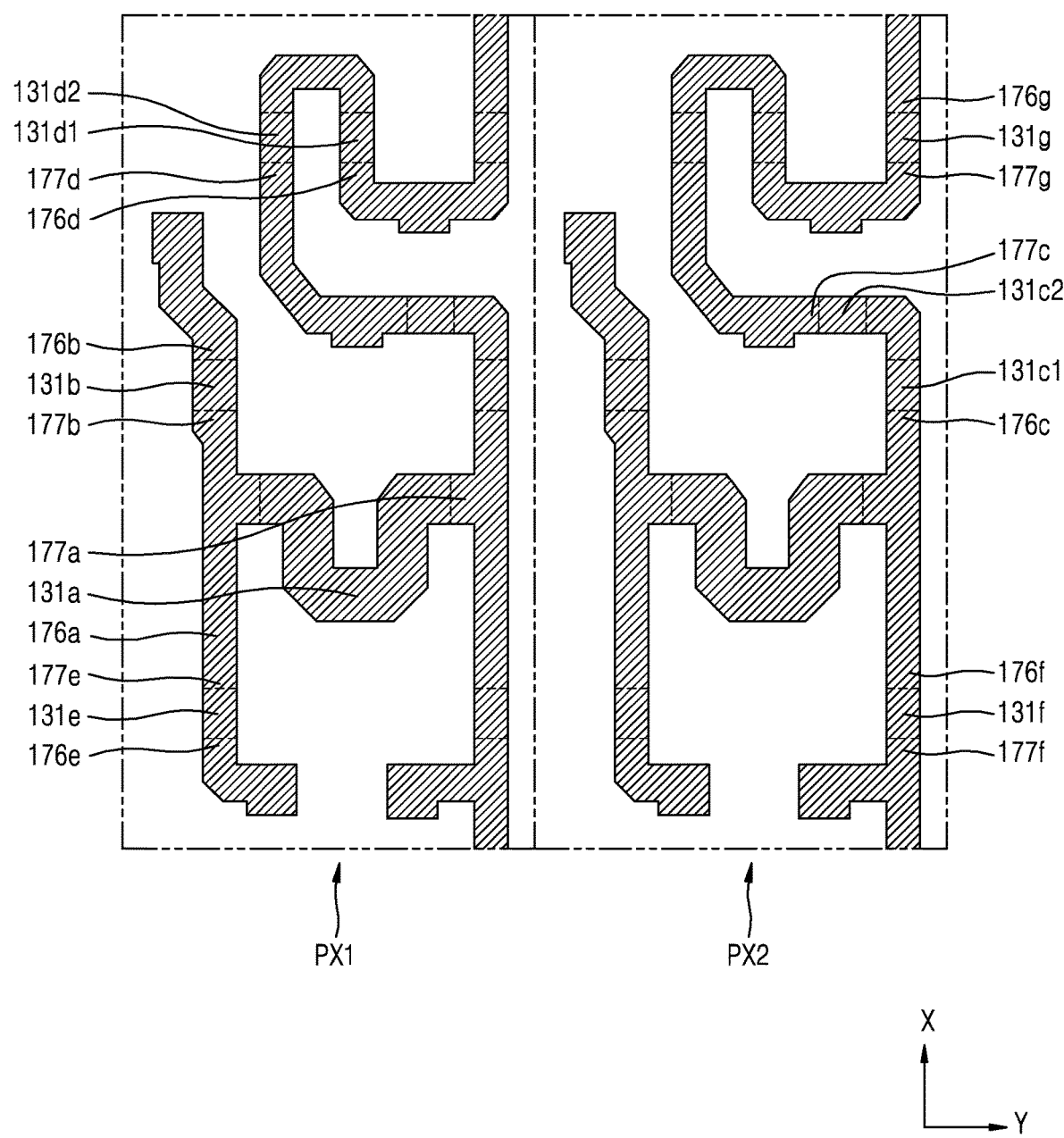
FIG. 10 is a layout diagram illustrating elements of the pixels of FIG. 9 in a layer according to an embodiment.

The semiconductor layer may include a channel region 131a of the first TFT T1, a channel region 131b of the second TFT T2, channel regions 131c1 and 131c2 of the third TFT T3, channel regions 131d1 and 131d2 of the fourth TFT T4, a channel region 131e of the fifth TFT T5, a channel region 131f of the sixth TFT T6, and a channel region 131g of the seventh TFT T7. That is, it will be understood that each channel region of the first through seventh TFTs T1 through T7 is some of the semiconductor layer, as shown in FIG. 10. The channel region 131a of the first TFT T1 may have a curvature and thus may be formed long. Thus, the driving range of a gate voltage applied to the gate electrode G1 may be increased. There may be various embodiments of the shape of the channel region 131a of the first TFT T1, including ' ⊏ '-, ' ⊇ '-, 'S'-, 'M'-, and 'W'-shapes.

The semiconductor layer may include polysilicon. The semiconductor layer may include source regions and drain regions with intervening channel regions. Each of the source regions and the drain regions may be a region into which an impurity is doped. The impurity may vary according to the type of a TFT and may include an N-type impurity or a P-type impurity. A channel region, a source region in one side of the channel region, and a drain region in the other side of the channel region may be referred to as an active layer. That is, the TFT has an active layer and the active layer includes a channel region, a source region and a drain region.

Figure 12:
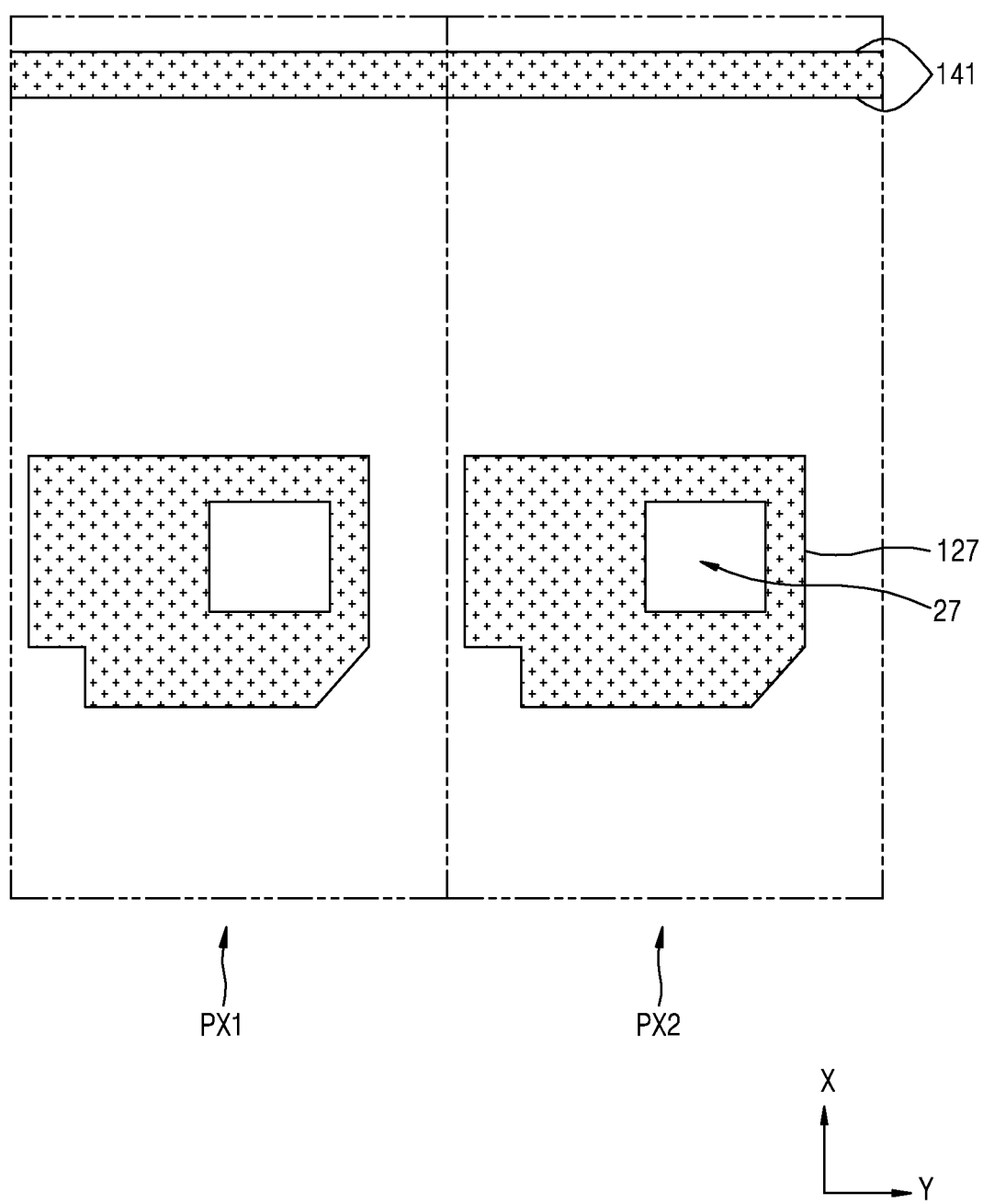
FIG. 12 is a layout diagram illustrating elements of the pixels of FIG. 9 in a layer according to an embodiment.

As shown in FIG. 12, the semiconductor layer may include a source region 176a and a drain region 177a of the first transistor T1, a source region 176b and a drain region 177b of the second transistor T2, a source region 176c and a drain region 177c of the third transistor T3, a source region 176d and a drain region 177d of the fourth transistor T4, a source region 176e and a drain region 177e of the fifth transistor T5, a source region 176f and a drain region 177f of the sixth transistor T6, and a source region 176g and a drain region 177g of the seventh transistor T7. The source region or the drain region may be interpreted as a source electrode or drain electrode of a TFT in some cases. That is, for example, each of the source electrode and the drain electrode of the first TFT T1 may be a source region 176a and a drain region 177a into which an impurity is doped, in the vicinity of the channel region 131a in the semiconductor layer shown in FIG. 10.

A first insulating layer 320 including an inorganic insulating material, such as a silicon nitride, a silicon oxide, or a silicon oxynitride, may be on the semiconductor layer.

The first insulating layer 320 may include a gate electrode 125a of the first TFT, a gate electrode 125b of the second TFT T2, gate electrodes 125c1 and 125c2 of the third TFT T3, gate electrodes 125d1 and 125d2 of the fourth TFT T4, a gate electrode 125e of the fifth TFT T5, a gate electrode 125f of the sixth TFT T6, and a gate electrode 125g of the seventh TFT T7. The first scan line 121, the second scan line 122, and the emission control line 123 each including the same material as a material for forming the gate electrodes of the first through seventh TFTs T1 through T7 and each being positioned on the same layer may be positioned on the first insulating layer 320 and extend in the second direction.

Figure 11:
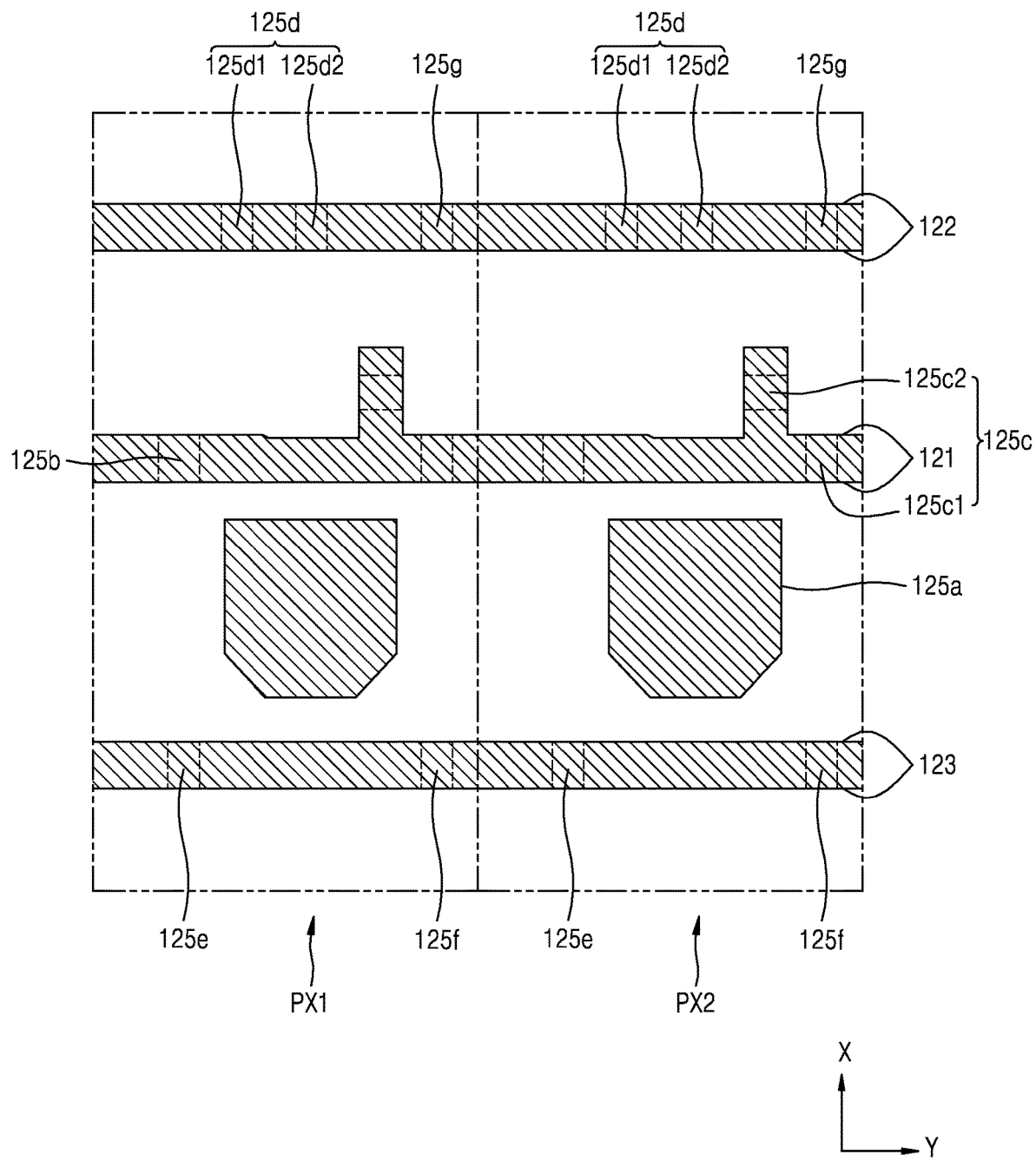
FIG. 11 is a layout diagram illustrating elements of the pixels of FIG. 9 in a layer according to an embodiment.

As shown in FIG. 11, the gate electrode 125b of the second TFT T2 and the gate electrodes 125c1 and 125c2 of the third TFT T3 may be parts of the first scan line 121 that crosses the semiconductor layer or protrudes from the first scan line 121, and the gate electrodes 125d1 and 125d2 of the fourth TFT T4 and the gate electrode 125g of the seventh TFT T7 may be parts of the second scan line 122 that crosses the semiconductor layer or protrudes from the second scan line 122, and the gate electrode 125e of the fifth TFT T5 and the gate electrode 125f of the sixth TFT T6 may be parts of the emission control line 123 that crosses the semiconductor layer or protrudes from the emission control line 123. The gate electrode 125a of the first TFT T1 may be of an island type.

In FIGS. 9 and 11, each of the third TFT T3 and the fourth TFT T4 has a dual gate electrode. In embodiments, each of the third TFT T3 and the fourth TFT T4 may have one gate electrode. There may be various modifications, wherein at least one of other TFTs T1, T2, T5, T6, and T7 than the third TFT T3 and the fourth TFT T4 may have a dual gate electrode.

The capacitor Cst may overlap the first TFT T1. A first electrode that is a lower electrode of the capacitor may be the gate electrode 125a of the first TFT T1. In an embodiment, the capacitor Cst may not overlap the first TFT T1, and the first electrode 125a of the capacitor Cst may be a separate independent component from the gate electrode 125a of the first TFT T1.

A second insulating layer 331 may be positioned on gate electrodes of the first through seventh TFTs T1 through T7. The second insulating layer 331 may include an inorganic insulating material, such as a silicon nitride, a silicon oxide, or a silicon oxynitride.

A second electrode 127 that is an upper electrode of the capacitor Cst may be positioned on the second insulating layer 331. As shown in FIG. 12, an opening 27 may be formed in the second electrode 127 of the capacitor Cst. A connection member 174 may be used to electrically connect the first electrode 125a of the capacitor Cst to the drain region 177c of the third TFT T3 via the opening 27. An initialization voltage line 141 may be positioned on the same layer as the second electrode 127 of the capacitor Cst on the second insulating layer 331.

A third insulating layer 332 may be positioned on the second electrode 127 of the capacitor Cst. The third insulating layer 332 may include an inorganic insulating material, such as a silicon nitride, a silicon oxide, or a silicon oxynitride.

A data line 171 and a power supply voltage line 172 may be positioned on the third insulating layer 332. The data line 171 may be connected to the source region 176b of the second TFT T2 via a contact hole 164, which is formed in the first insulating layer 320, the second insulating layer 331, and the third insulating layer 332. The power supply voltage line 172 may be connected to the second electrode 127 of the capacitor Cst via a contact hole 168 formed in the third insulating layer 332 and may be connected to a lower semiconductor layer via contact holes 165 and 169, which are formed in the first insulating layer 320, the second insulating layer 331, and the third insulating layer 332.

Figure 13:
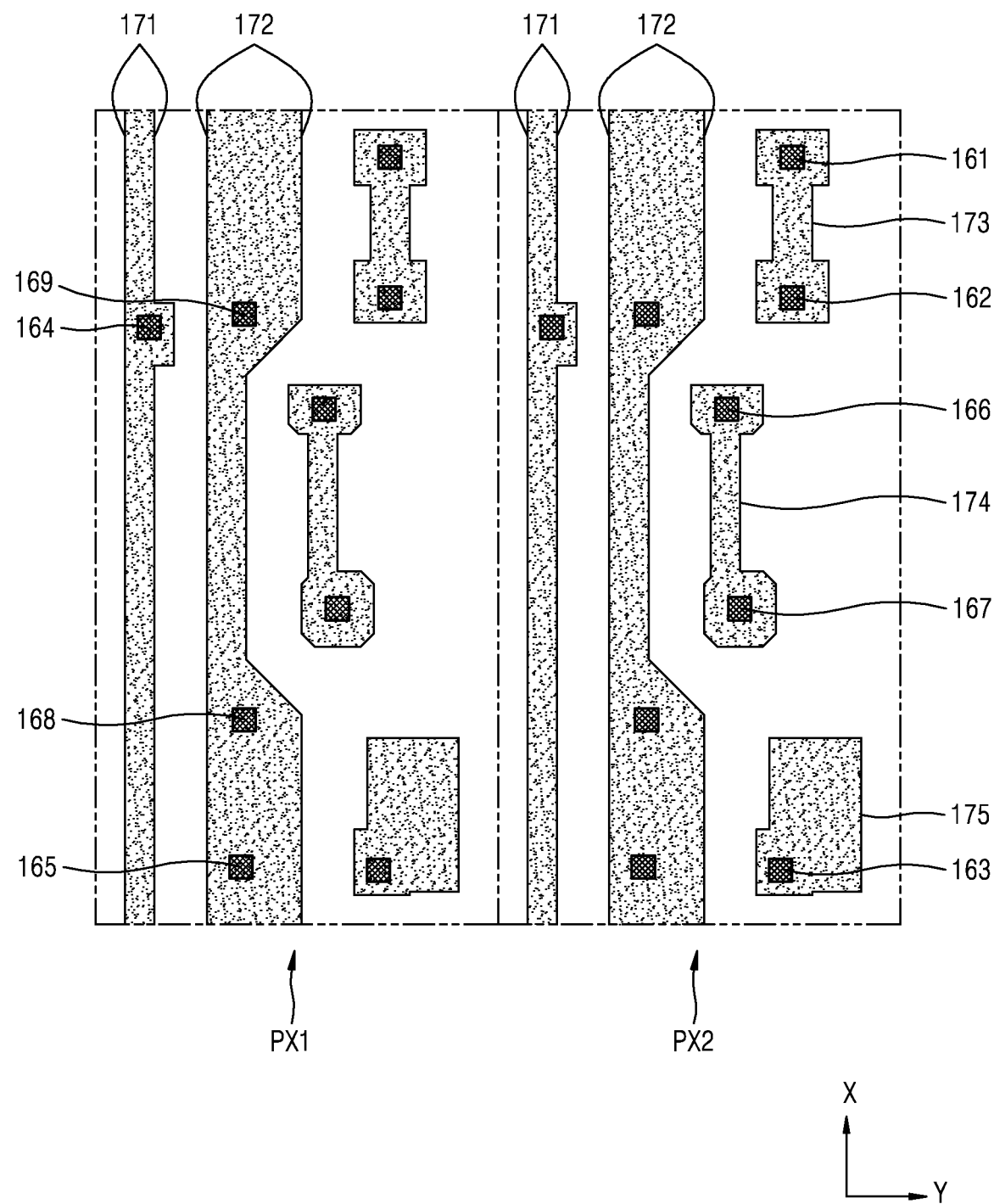
FIG. 13 is a layout diagram illustrating elements of the pixels of FIG. 9 in a layer according to an embodiment.

The conductive layers may be further positioned on the third insulating layer 332. For example, connection members 173, 174, and 175 may be formed on the third insulating layer 332, as shown in FIG. 13. One end of the connection member 173 may be connected to the initialization voltage line 141 via a contact hole 161, which is formed in the second insulating layer 331 and the third insulating layer 332, and the other end of the connection member 173 may be connected to the source region 176d of the fourth TFT T4 via the contact hole 162, which is formed in the first insulating layer 320, the second insulating layer 331, and the third insulating layer 332. One end of the connection member 174 may be connected to the drain region 177c of the third TFT T3 via a contact hole 166, which is formed in the first insulating layer 320, the second insulating layer 331, and the third insulating layer 332, and the other end of the connection member 174 may be connected to the gate electrode 125a of the first TFT T1 via a contact hole 167, which is formed in the second insulating layer 331 and the third insulating layer 332. In this case, the other end of the connection member 174 may be connected to the gate electrode 125a of the first TFT T1 (or the first electrode 125a of the capacitor Cst) via the opening 27 formed in the second electrode 127 of the capacitor Cst. The connection member 175 may be connected to the drain region 177f of the sixth TFT T6 via the contact hole 163, which is formed in the first insulating layer 320, the second insulating layer 331, and the third insulating layer 332. The connection member 175 may be electrically connected to the pixel electrode 410.

Figure 14:
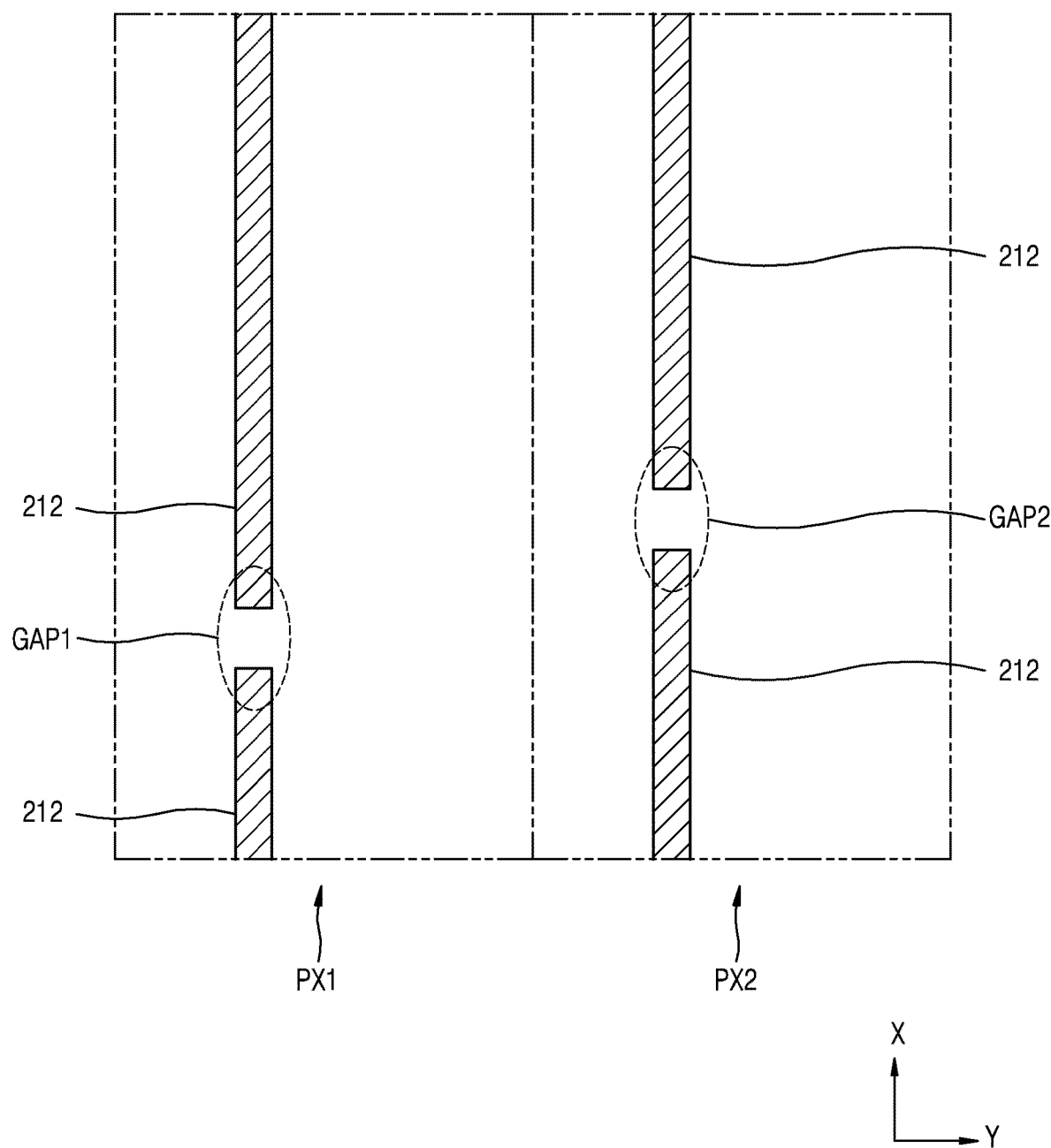
FIG. 14 is a layout diagram illustrating elements of the pixels of FIG. 9 in a layer according to an embodiment.

A fourth insulating layer 341 may be positioned on the data line 171 and the power supply voltage line 172. A first connection line 210 may be positioned on the fourth insulating layer 341, as shown in FIG. 14. In the first area S1, the first connection line 210 may include sections 212, which are separated from one another. The first connection line 210 may have a single layer or multi-layer structure including at least one of aluminum (Al), copper (Cu), titanium (Ti), and an alloy of some of the metals. The first connection line 210 may extend in the first direction. The first connection line 210 may overlap at least some of the power supply voltage line 172. The position of a gap GAP1 of the sections 212 of the first connection line 210 in the first pixel PX1 and the position of a gap GAP2 of the sections 212 of the first connection line 210 in the second pixel PX2 may be different from each other. A fifth insulating layer 342 may be positioned on the first connection line 210.

Each of the fourth insulating layer 341 and the fifth insulating layer 342 may include general-purpose polymer, such as imide-based polymer, polymethylmethacrylate (PMMA), polystyrene (PS), a polymer derivative having a phenol-based group, acryl-based polymer, arylether-based polymer, amide-based polymer, fluorine-based polymer, p-xylene-based polymer, vinyl alcohol-based polymer, and a blend of some of the polymers.

An OLED 400 may be positioned on the fifth insulating layer 342. The OLED 400 may include a pixel electrode 410, an opposite electrode 430, and an intermediate layer 420 between the pixel electrode 410 and the opposite electrode 430.

The pixel electrode 410 may be a (semi-)transparent electrode or reflective electrode. When the pixel electrode 410 is a (semi-)transparent electrode, the pixel electrode 410 may include an indium tin oxide (ITO), an indium zinc oxide (IZO), a zinc oxide (ZnO), $In_2O_3$, an indium gallium oxide (IGO), or an aluminum zinc oxide (AZO). When the pixel electrode 410 is a reflective electrode, the pixel electrode 410 may have a reflective layer including silver (Ag), magnesium (Mg), Al, platinum (Pt), palladium (Pd), gold (Au), nickel (Ni), neodymium (Nd), iridium (Ir), chromium (Cr), and a compound thereof, and a layer including an ITO, an IZO, a ZnO, In2O3, an IGO, or an AZO. The pixel electrode 410 may have a single layer or multi-layer structure.

A shielding member 450 may be further positioned on the fifth insulating layer 342. The shielding member 450 may extend in the second direction along some of the edge of the pixel electrode 410 not to overlap the pixel electrode in a plan view and may be positioned at an upper side or lower side of each row. The shielding member 450 may have the shape of a straight line that extends in the second direction or a zigzag shape according to the arrangement of the pixel electrodes 410 in the same row. The shielding member 450 may include light-shielding metal. For example, the shielding member 450 may include molybdenum (Mo), Al, Cu, Ti, and the like and may have a multi-layer or single layer structure including the above-described materials. In an embodiment, the shielding member 450 may have a multi-layer structure of Ti/Al/Ti. The shielding member 450 may include the same material as a material for forming the pixel electrode 410. The shielding members 450 may be spaced from one another and independently provided in each row. The shielding members 450 may be floated and may be electrically connected to a constant voltage wiring, and a constant voltage may be applied to the shielding members 450. The constant voltage may be an initialization voltage VINT.

Figure 15:
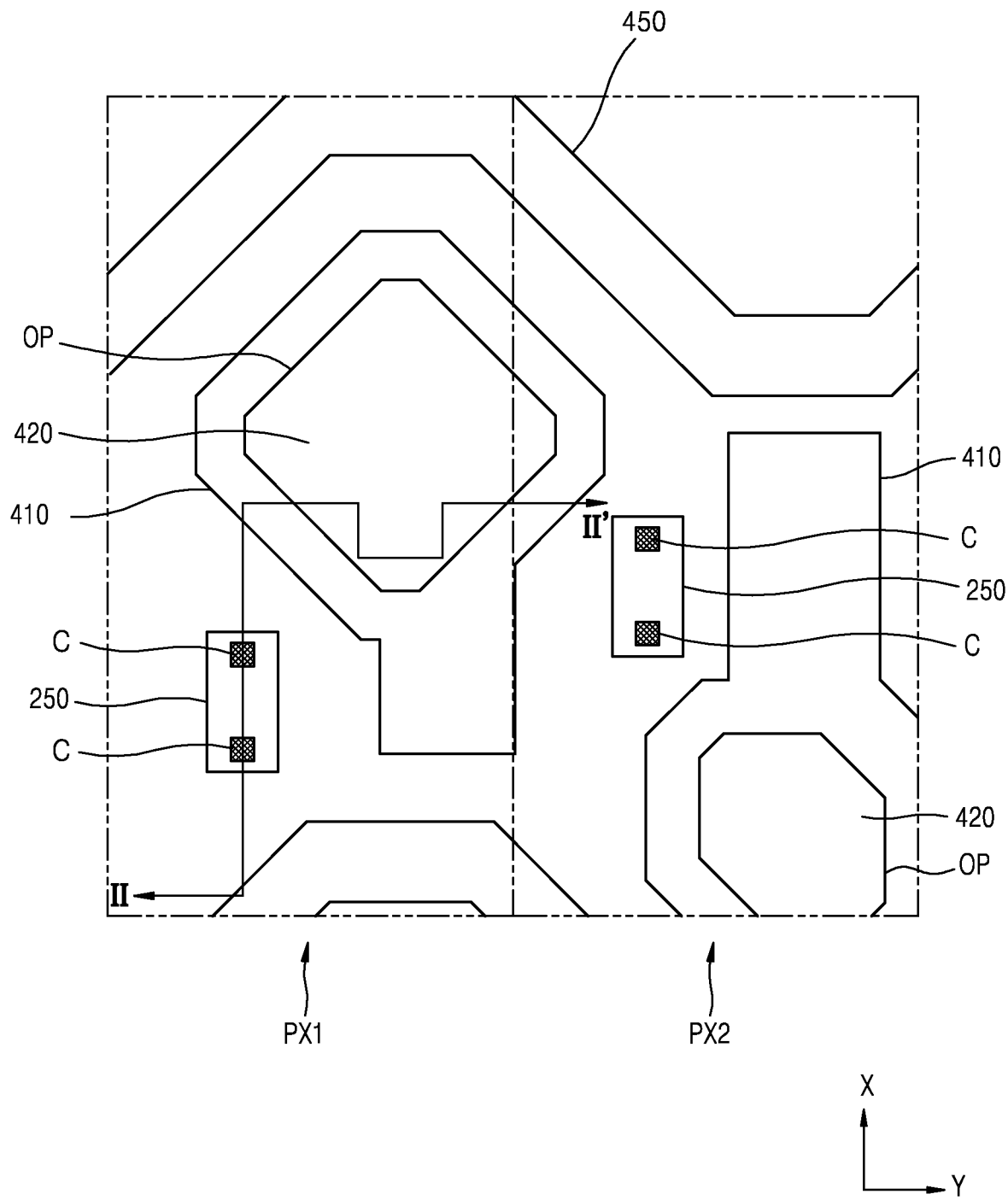
FIG. 15 is a layout diagram illustrating elements of the pixels of FIG. 9 in a layer according to an embodiment.
Figure 16:
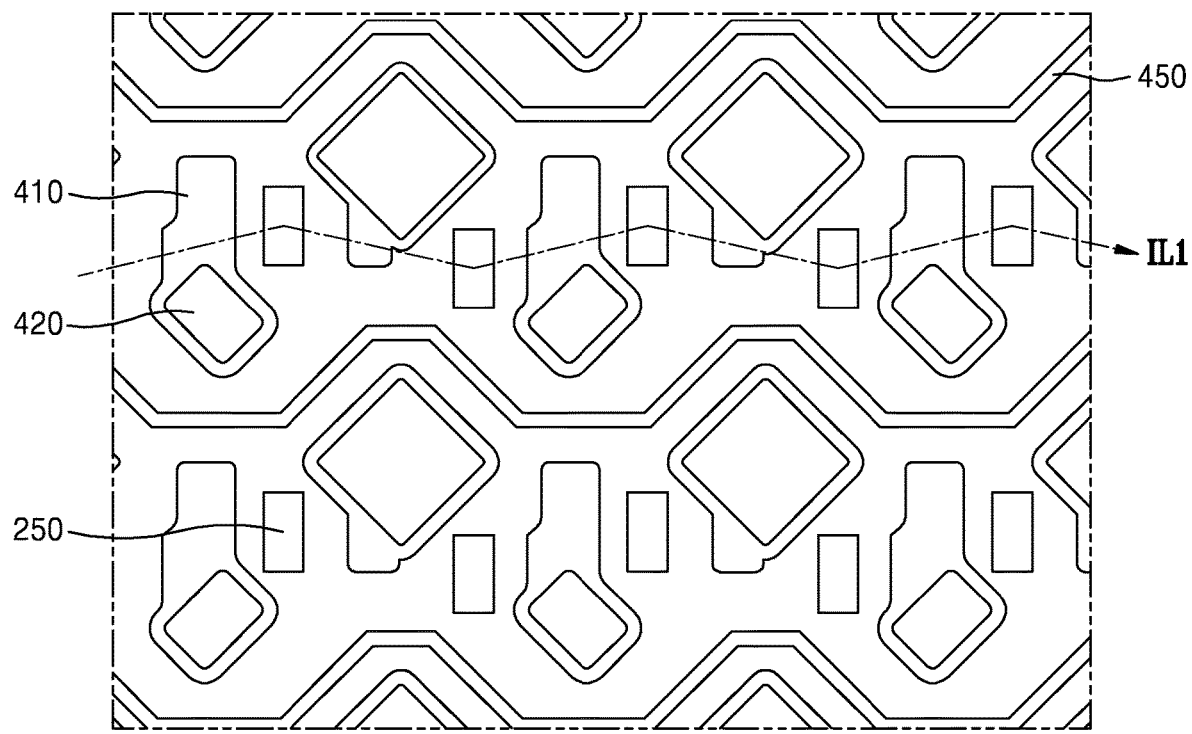
FIG. 16 is a layout diagram illustrating elements of the pixels of FIG. 9 in a layer according to an embodiment.
Figure 17:
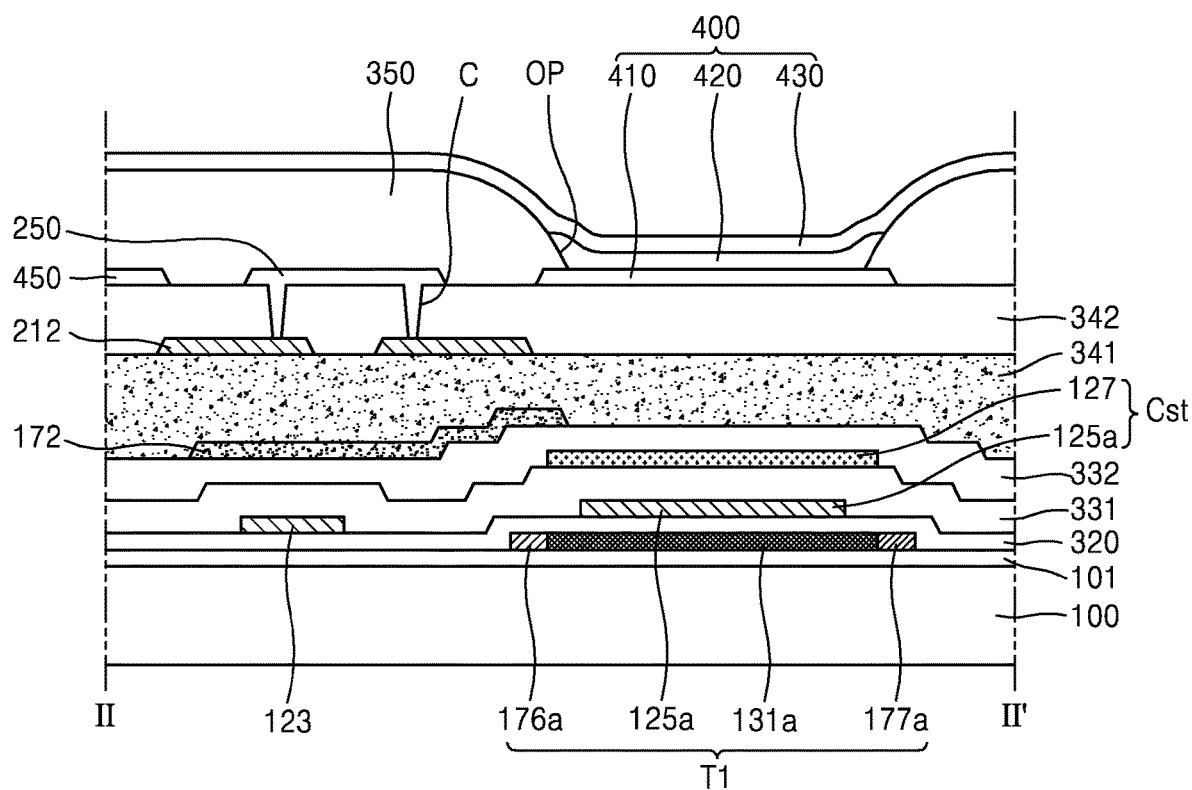
FIG. 17 is a cross-sectional view illustrating a part of the display device of FIG. 2 according to an embodiment.

As shown in FIG. 15 FIG. 16, and FIG. 17, a bridge 250 that electrically connects the sections 212 of the first connection line 210 may be positioned on the fifth insulating layer 342. The bridge 250 may include the same material as a material for forming the pixel electrode 410 and may be positioned on the same layer as the pixel electrode 410. The bridge 250 may electrically connect the sections 212 of the first connection line 210 arranged in a lower layer via contact holes C formed in the fifth insulating layer 342. The bridge 250 may not overlap the pixel electrode 410 and the shielding member 450 in a direction perpendicular to the substrate 100. As shown in FIG. 16, the bridges 250 arranged in the same row may be positioned in a zigzag form in the second direction according to the arrangement of the pixel electrodes 410. A virtual line IL1 that connects centers of the bridges 250 in the same row may not be in parallel to the first direction or the second direction. The centers of the bridges 250 may not be aligned. The position of the gap GAP1 of the sections 212 of the first connection line 210 arranged in the first pixel PX1 and the position of the gap GAP2 of the sections 212 of the first connection line 210 arranged in the second pixel PX2 may be determined according to positions of the bridges 250.

A sixth insulating layer 350 that covers the end of the pixel electrode 410 may be positioned on the fifth insulating layer 342. The sixth insulating layer 350 may have an opening OP for exposing a portion of the pixel electrode 410, thereby defining a pixel. The sixth insulating layer 350 may include an organic material, such as benzocyclobutene (BCB), polyimide, or hexamethyldisiloxane (HMDSO). Alternatively, the sixth insulating layer 350 may include one or more inorganic materials.

An intermediate layer 420 may be formed on the pixel electrode 410 exposed by the opening OP of the sixth insulating layer 350. The intermediate layer 420 may include at least an emissive layer (EML) and may further include at least one functional layer of a hole injection layer (HIL), a hole transport layer (HTL), an electron transport layer (ETL), and an electron injection layer (EIL). In an embodiment, the intermediate layer 420 may include a first functional layer arranged under the EML and/or a second functional layer arranged on the EML. The first functional layer and/or the second functional layer may include an integral layer in the entirety of the pixel electrodes 410, or a layer patterned to correspond to each of the pixel electrodes 410. The EML may include a red emissive layer, a green emissive layer, or a blue emissive layer. Alternatively, the EML may have a multi-layer structure in which the red emissive layer, the green emissive layer and the blue emissive layer are stacked on one another, so as to emit white light, or a single layer structure including a red emissive material, a green emissive material, and a blue emissive material.

The opposite electrode 430 may cover the display area (see DA of FIG. 2) and may be positioned on the intermediate layer 420 and on an upper portion of the sixth insulating layer 350. The opposite electrode 430 may cover some of the peripheral area (see PA of FIG. 2). The opposite electrode 430 may include a semipermeable reflective layer including at least one selected from the group consisting of lithium (Li), calcium (Ca), lithium fluoride (LiF), Al, Mg, and Ag, or a light-transmitting metal oxide, such as ITO, IZO, or ZnO, and may have a single layer or multi-layer structure.

Figure 18:
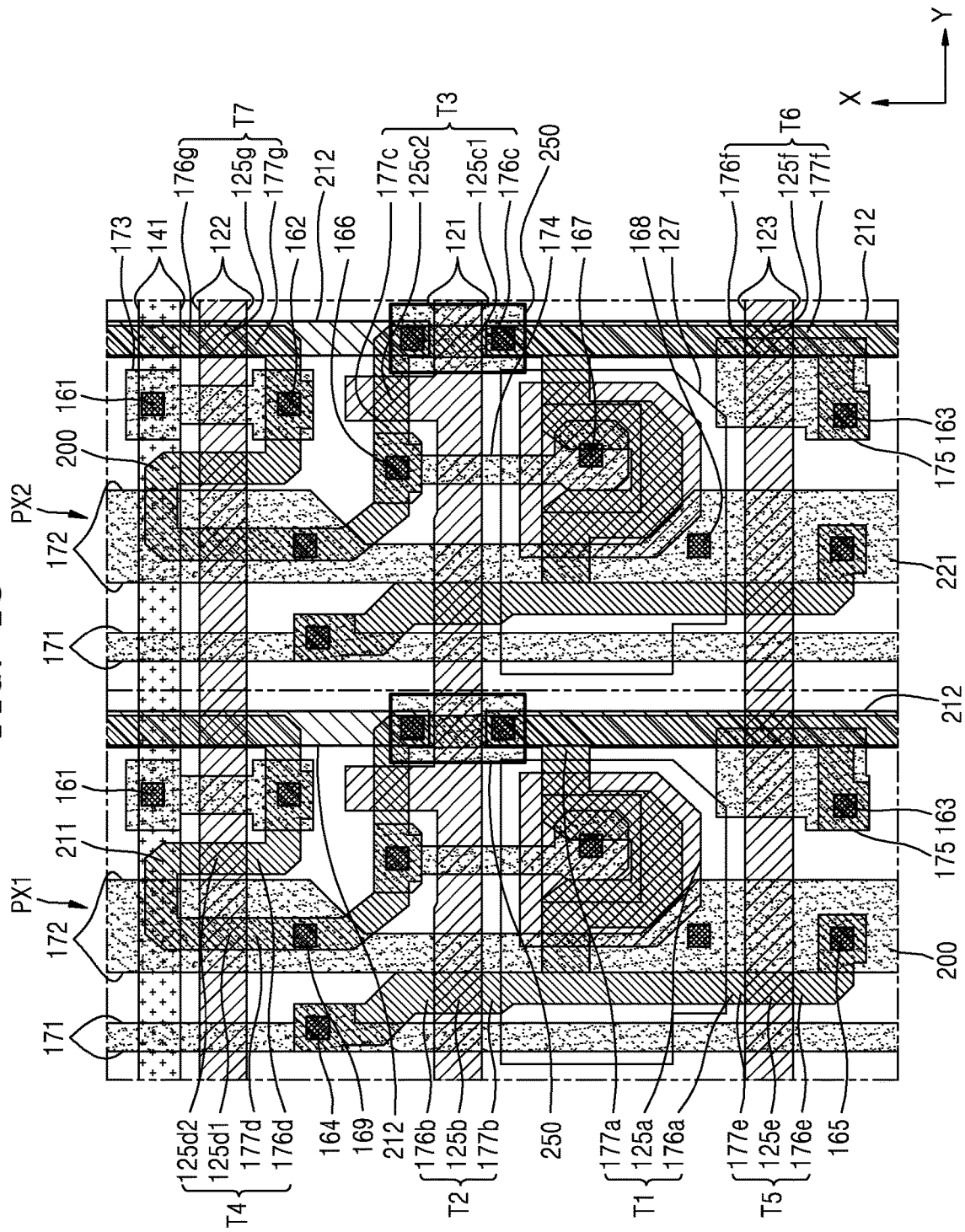
FIG. 18 is a layout diagram illustrating pixels of the display device according to an embodiment.
Figure 19:
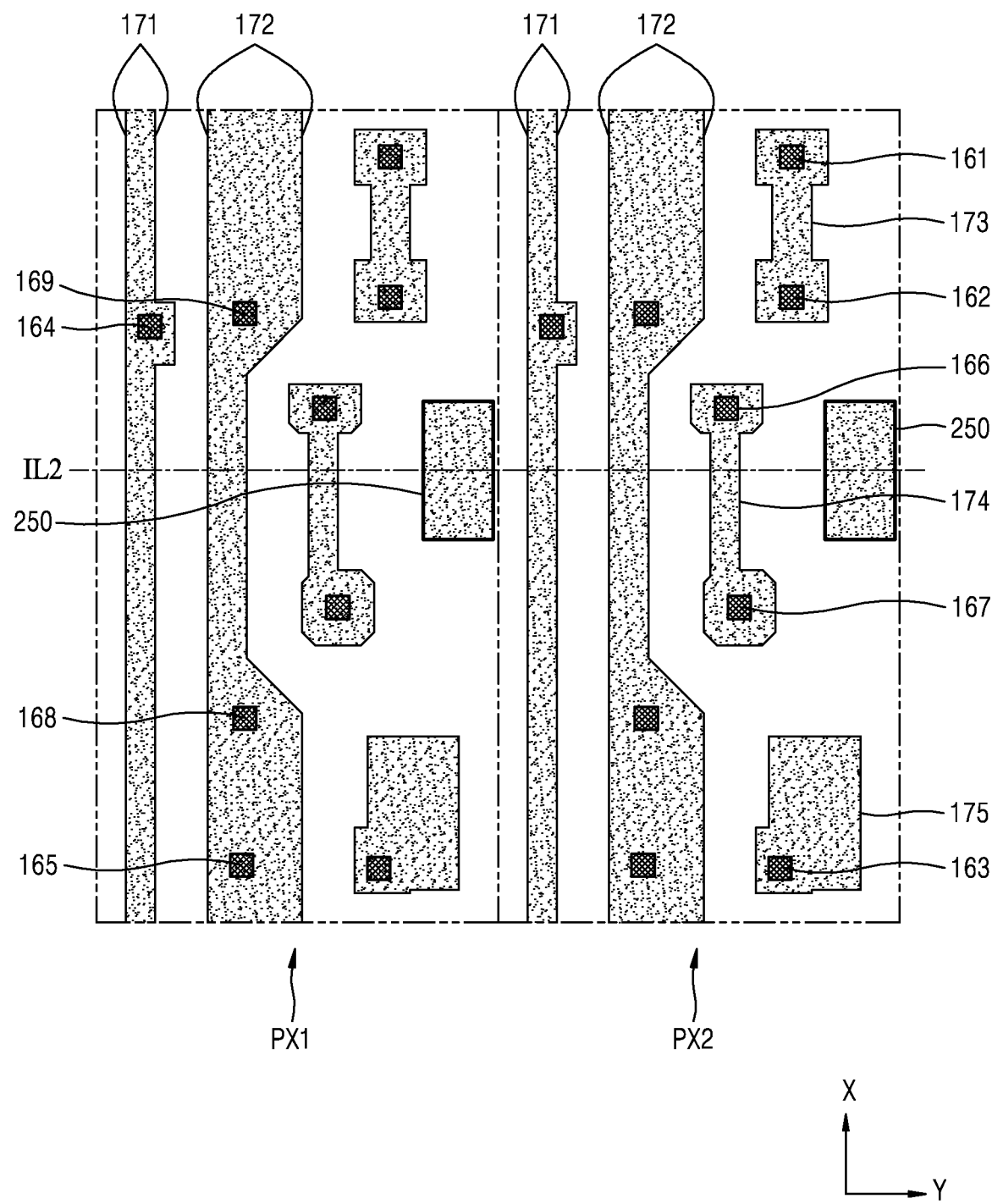
FIG. 19 is a layout diagram illustrating elements of the pixels of FIG. 18 in a layer according to an embodiment.
Figure 20:
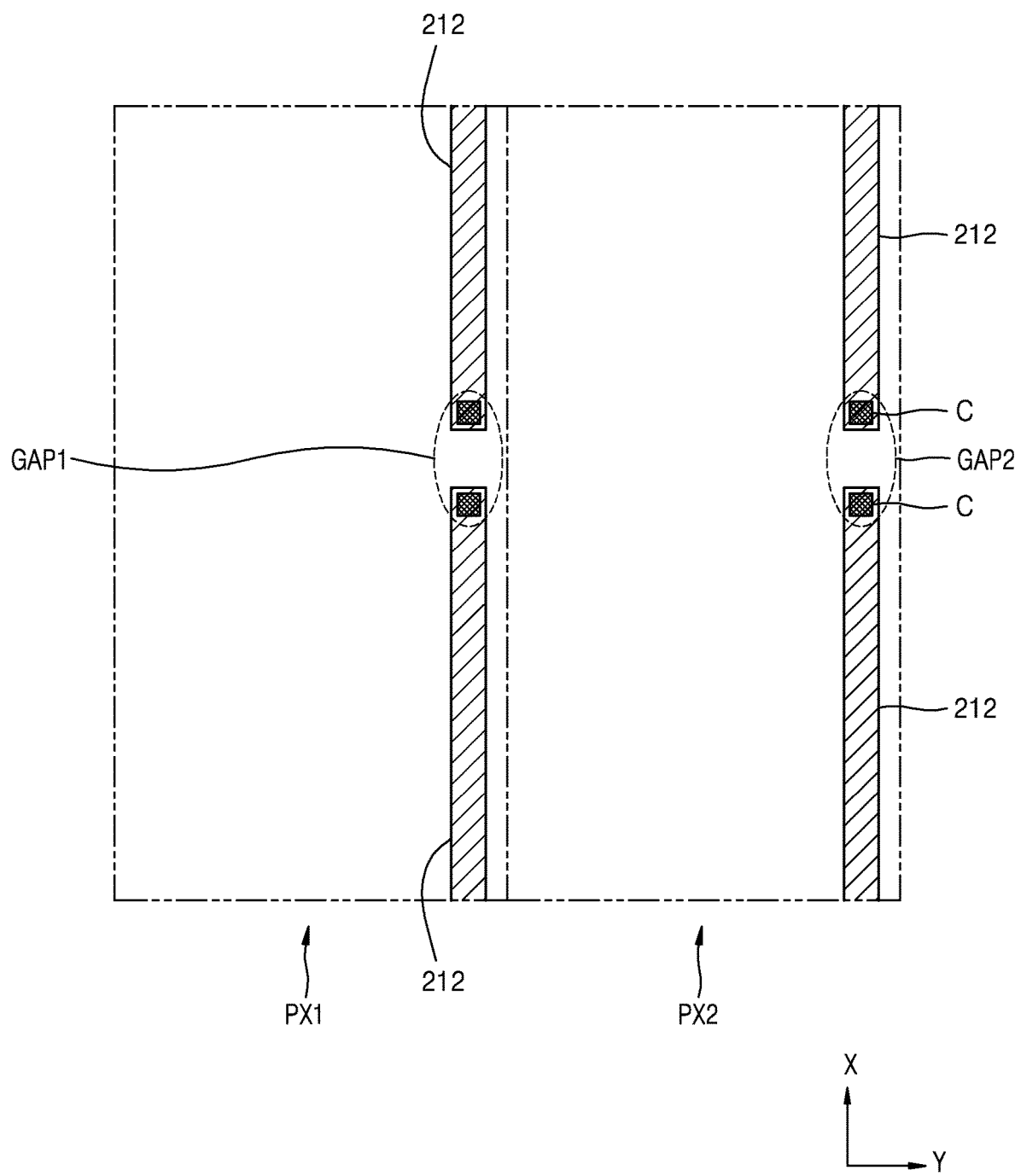
FIG. 20 is a layout diagram illustrating elements of the pixels of FIG. 18 in a layer according to an embodiment.
Figure 21:
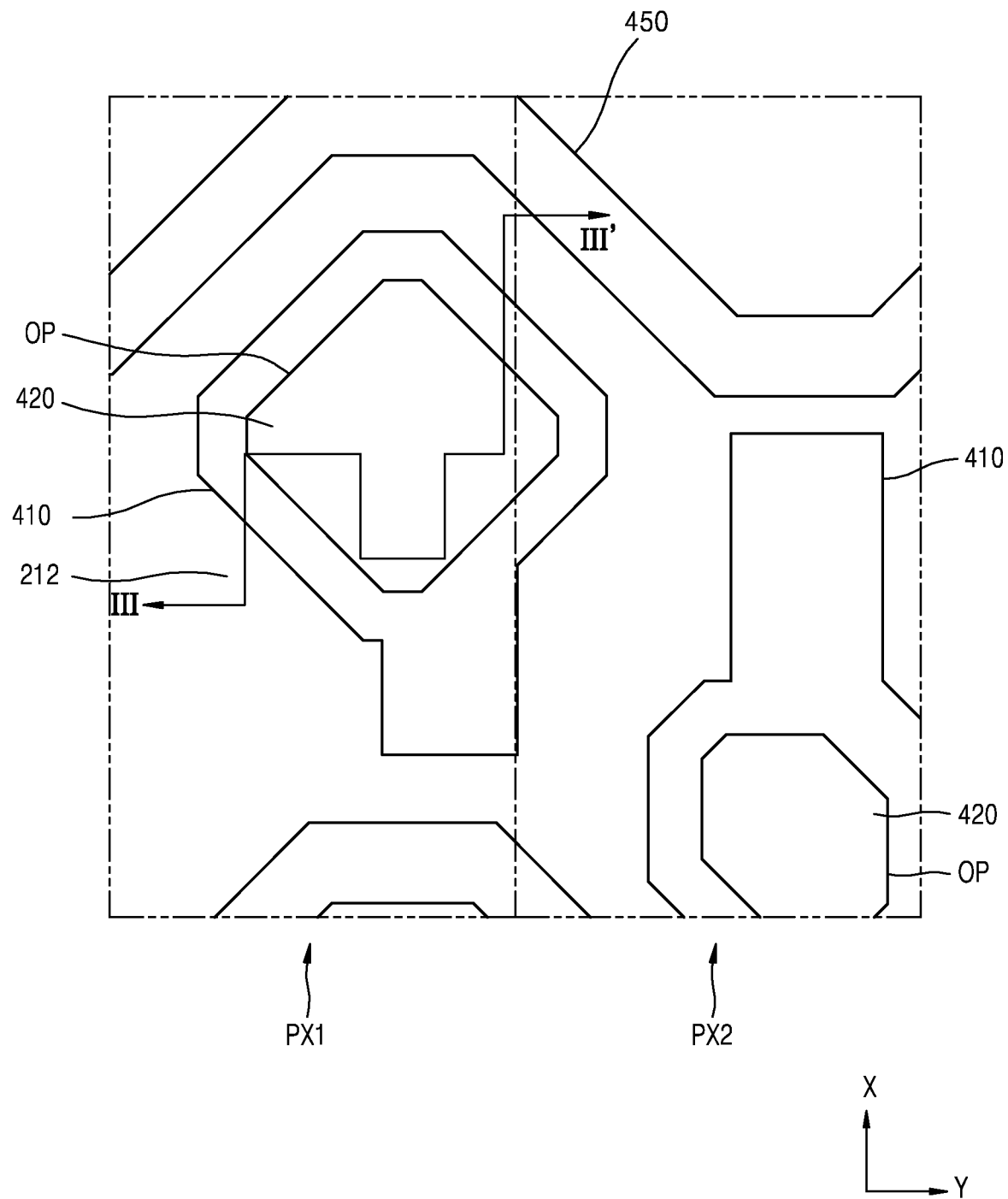
FIG. 21 is a layout diagram illustrating elements of the pixels of FIG. 18 in a layer according to an embodiment.
Figure 22:
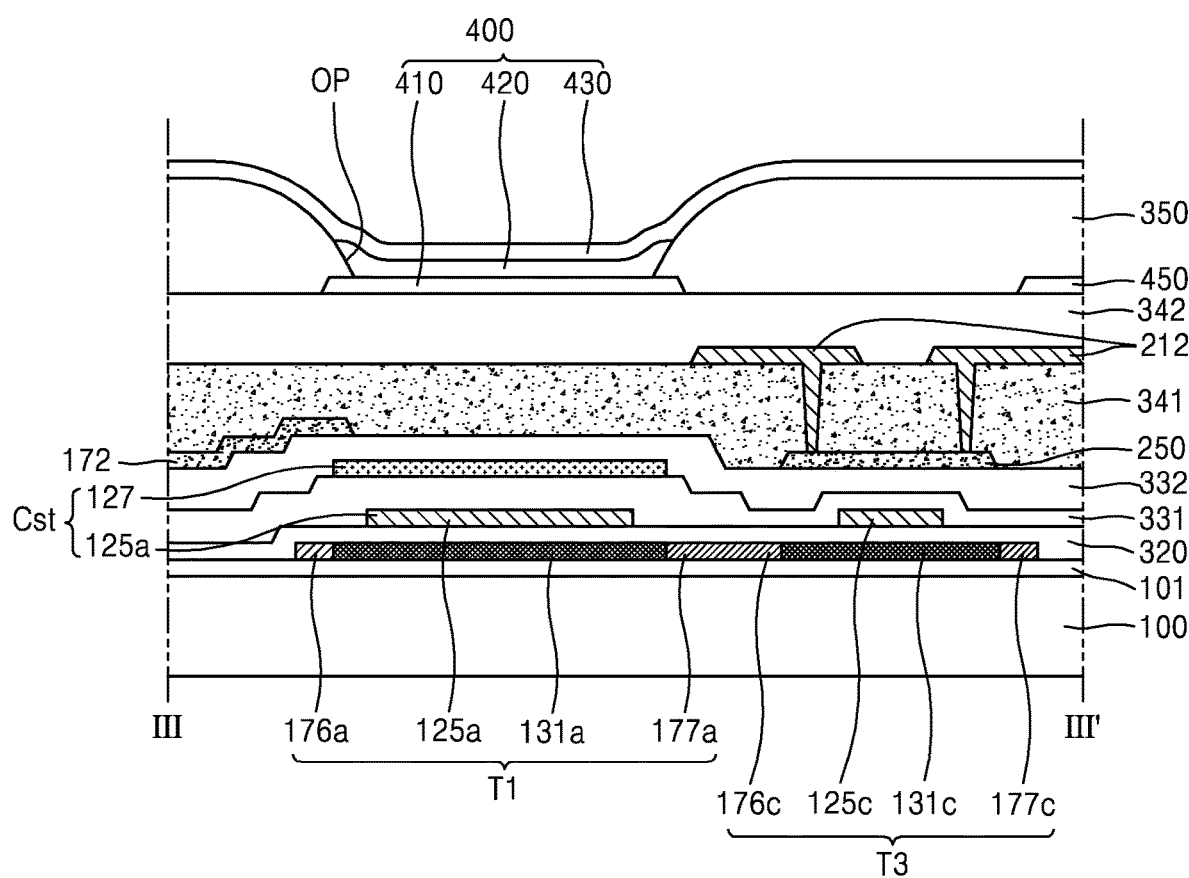
FIG. 22 is a cross-sectional view illustrating a part of the display device of FIG. 2 according to an embodiment.

FIG. 18 is a layout diagram illustrating pixels of the display device 10 according to an embodiment. FIGS. 19 through 21 are layout diagrams illustrating elements of the pixels in different layers according to one or more embodiments. FIG. 22 is a cross-sectional view illustrating a part of the display device of FIG. 2. FIG. 22 illustrates a cross-section taken along a line III-III' that passes through a pixel electrode of FIG. 21 according to an embodiment. Some structures illustrated in one or more of FIGS. 19 through 21 may be identical to or analogous to some structures described with reference to one or more of FIGS. 9 through 17, and related description may not be repeated.

As shown in FIGS. 18 and 22, a pixel (e.g., the first pixel PX1 or the second pixel PX2) may be positioned on a substrate 100. Each of the first pixel PX1 and the second pixel PX2 may include first through seventh TFTs T1 through T7 and a capacitor Cst. Each of the first through seventh TFTs T1 through T7 may include a semiconductor layer and a gate electrode.

As shown in FIG. 10, FIG. 17, and FIG. 22, a semiconductor layer of each of the first through seventh TFTs T1 through T7 may be positioned on the buffer layer 101. The semiconductor layer may include a source region, a drain region, and a channel region between the source region and the drain region of each of the first through seventh TFTs T1 through T7. A first insulating layer 320 may be positioned on the semiconductor layer.

As shown in FIG. 11, FIG. 17, and FIG. 22, gate electrodes of the first through seventh TFTs T1 through T7, a first scan line 121, a second scan line 122, and an emission control line 123 may be positioned on the first insulating layer 320. A first electrode that is a lower electrode of the capacitor Cst may be a gate electrode 125*a* of the first TFT T1. A second insulating layer 331 may be positioned on the gate electrodes of the first through seventh TFTs T1 through T7.

As shown in FIG. 12, FIG. 17, and FIG. 22, a second electrode 127 that is an upper electrode of the capacitor Cst may be positioned on the second insulating layer 331. An opening 27 may be formed in the second electrode 127 of the capacitor Cst. A third insulating layer 332 may be positioned on the second electrode 127 of the capacitor Cst. An initialization voltage line 141 may be positioned on the same layer as the second electrode 127 of the capacitor Cst.

As shown in FIG. 19 and FIG. 22, a data line 171 and a power supply voltage line 172 may be positioned on the third insulating layer 332. Connection members 173, 174, and 175 may be further positioned on the third insulating layer 332. A bridge 250 that electrically connects the sections 212 of the first connection line 210 may be further positioned on the third insulating layer 332. The bridge 250 may include the same material as a material for forming the data line 171 and may be formed on the same layer as the data line 171. The bridge 250 may not overlap the data line 171, the power supply voltage line 172, and the connection members 173, 174, and 175 in a direction perpendicular to the substrate 100. The relative position of the bridge 250 in the first pixel PX1 and the relative position of the bridge 250 in the second pixel PX2 may be substantially the same. A virtual line IL2 that connects centers of the bridges 250 arranged in the same row may be parallel to the second direction. The centers of the bridges 250 arranged in the same row may be aligned in the second direction. A fourth insulating layer 341 may be positioned on the data line 171 and the power supply voltage line 172.

As shown in FIG. 20 and FIG. 22, sections 212 of the first connection line 210 may be positioned on the fourth insulating layer 341. The first connection line 210 extends in the first direction. The first connection line 210 may overlap at least some of portions of the semiconductor layer extending in the first direction. Each of the position of a gap GAP1 of the sections 212 of the first connection line 210 arranged in the first pixel PX1 and the position of a gap GAP2 of the sections 212 of the first connection line 210 arranged in the second pixel PX2 may correspond to positions of the lower bridges 250. The sections 212 of the first connection line 210 may be electrically connected to the corresponding bridges 250 arranged in a lower layer via contact holes C formed in the fourth insulating layer 341. A fifth insulating layer 342 may be positioned on the first connection line 210.

As shown in FIG. 21 and FIG. 22, an OLED 400 may be positioned on the fifth insulating layer 342. The OLED 400 may include a pixel electrode 410, an opposite electrode 430, and an intermediate layer 420 between the pixel electrode 410 and the opposite electrode 430. A shielding member 450 may be further positioned on the fifth insulating layer 342.

A sixth insulating layer 350 that covers the pixel electrode 410 and the shielding member 450 may be positioned on the fifth insulating layer 342. An opening OP for exposing a portion of the pixel electrode 410 may be formed in the sixth insulating layer 350. An intermediate layer 420 may be formed on the pixel electrode 410 exposed by the opening OP of the sixth insulating layer 350.

Figure 23:
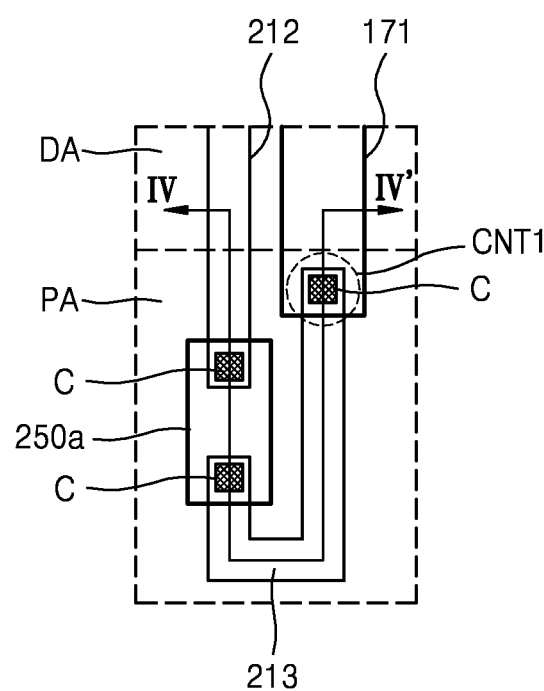
FIG. 23 is a plan view illustrating a portion B of FIG. 3 according to an embodiment.
Figure 24A:
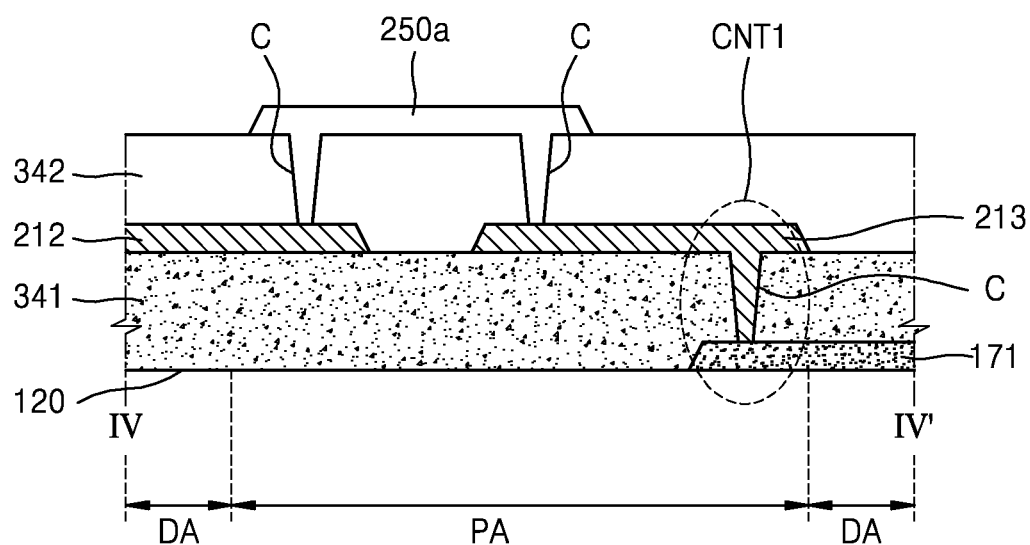
FIG. 24A is a cross-sectional view taken along a line IV-IV' of FIG. 23 according to an embodiment.
Figure 24B:
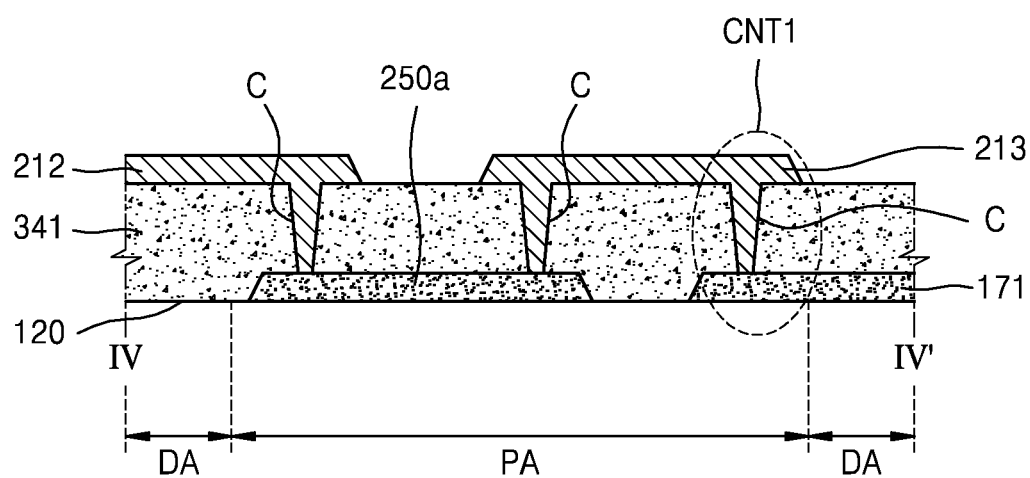
FIG. 24B is a cross-sectional view taken along the line IV-IV' of FIG. 23 according to an embodiment.

FIG. 23 is a plan view illustrating the portion B of FIG. 3 according to an embodiment. FIGS. 24A and 24B are cross-sectional views taken along a line IV-IV' of FIG. 23 according to embodiments.

In an embodiment, an ESD protection circuit may be provided in a peripheral area PA, may be positioned adjacent to a boundary between a display area DA and the peripheral area PA, and may be connected to a first connection line 210. Referring to FIG. 23, the first connection line 210 may be electrically connected to the corresponding data line 171 (or data line DL) at a first contact part CNT1. The first connection line 210 may extend from the display area DA to the peripheral area PA. The first connection line 210 may include a first section 212 positioned in both the display area DA and the peripheral area PA and may include a second section 213 spaced from the first section 212 and positioned in the peripheral area PA. Each section of the first connection line 210 may be connected to the corresponding ESD protection circuit. The ESD protection circuit may be/include a bridge 250*a* that electrically connects the first section 212 to the second section 213 near the boundary between the display area DA and the peripheral area PA.

Referring to FIGS. 24A and 24B, the bridge 250*a* may be positioned on a layer different from a layer on which the first section 212 and the second section 213 are positioned, and may be electrically connected to the first section 212 and the second section 213 via contact holes C.

In an embodiment, as shown in FIG. 24A, the first section 212 and the second section 213 of the first connection line 210 may be substantially positioned between the fourth insulating layer 341 and the fifth insulating layer 342. The bridge 250*a* may be positioned on the fifth insulating layer 342. The bridge 250*a* may be positioned on the same layer as the pixel electrode 410. The bridge 250*a* may connect the first section 212 to the second section 213 via contact holes C. The second section 213 may be electrically connected to the corresponding data line 171 lower than the second section 213 via a contact hole C at the first contact part CNT1. The data line 171 may be positioned on an insulation surface 120 of the third insulating layer 332 (shown in FIG. 17 or FIG. 22) and may be positioned between the second section 213 and the third insulating layer 332. The first contact part CNT1 and the bridge 250*a* may be positioned in the peripheral area PA and may be positioned adjacent to the boundary between the display area DA and the peripheral area PA.

In an embodiment, as shown in FIG. 24B, the first section 212 and the second section 213 of the first connection line 210 may be positioned on the fourth insulating layer 341. The bridge 250*a* may be positioned on an insulation surface 120 of the third insulating layer 332 (shown in FIG. 17 or FIG. 22) and may be positioned between the first connection line 210 and the third insulating layer 332. The bridge 250*a* may be positioned on the same layer as data line 171. The bridge 250*a* may connect the first section 212 to the second section 213 via contact holes C. The second section 213 may be electrically connected to the corresponding data line 171 (positioned between the second section 213 and the third insulating layer 332) via a contact hole C at the first contact part CNT1. The first contact part CNT1 and the bridge 250*a* may be positioned in the peripheral area PA and may be adjacent to the boundary between the display area DA and the peripheral area PA.

Figure 25:
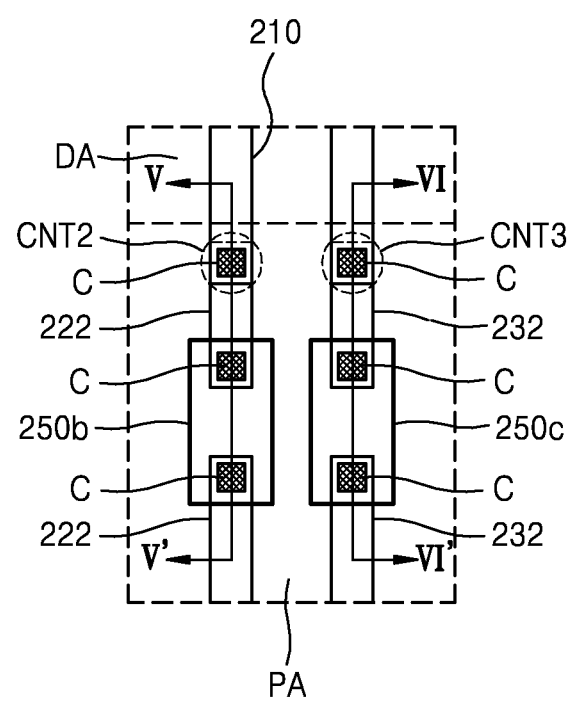
FIG. 25 is a plan view illustrating a portion E of FIG. 3 according to an embodiment.
Figure 26A:
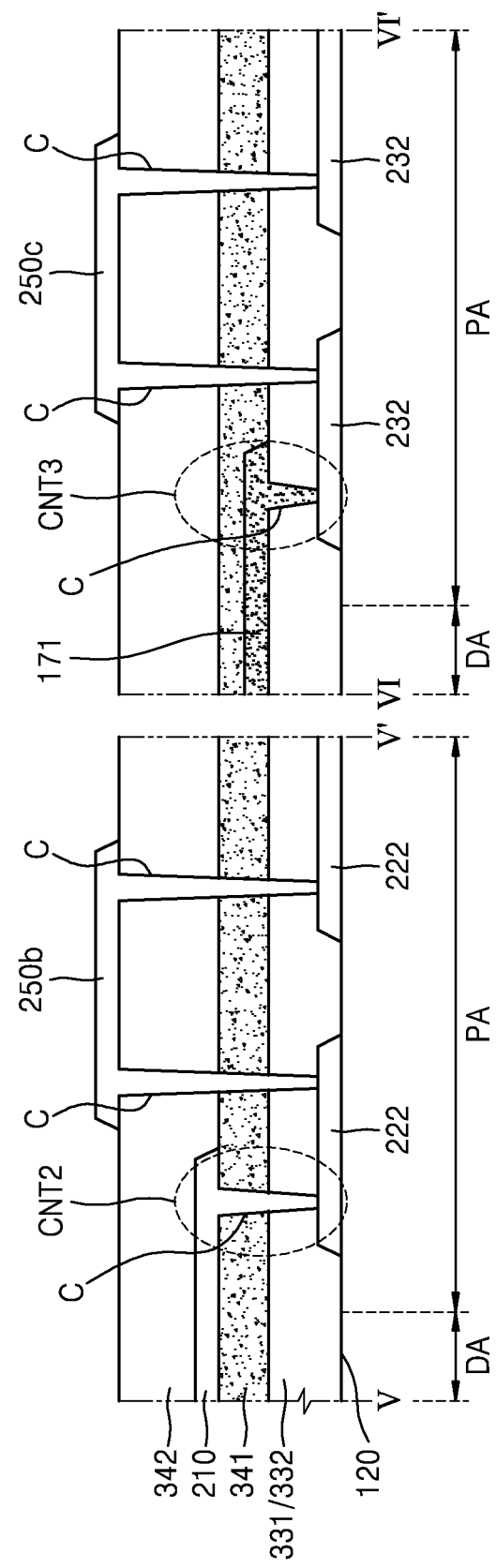
FIG. 26A is a cross-sectional view taken along lines V-V and VI-VI' of FIG. 25 according to an embodiment.
Figure 26B:
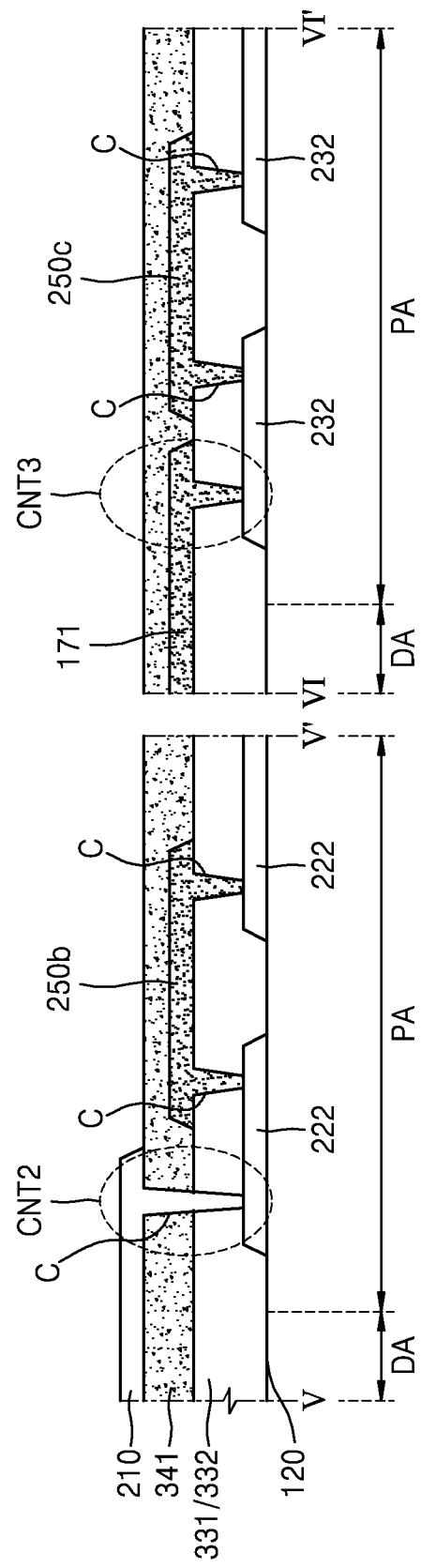
FIG. 26B is a cross-sectional view taken along the lines V-V' and VI-VI' of FIG. 25 according to an embodiment.

FIG. 25 is a plan view illustrating the portion E of FIG. 3 according to an embodiment. FIGS. 26A and 26B are cross-sectional views taken along lines V-V' and VI-VI' of FIG. 25 according to embodiments.

In an embodiment, an ESD protection circuit may be provided in a peripheral area PA, may be positioned adjacent to a boundary between the display area DA and the peripheral area PA, and may be connected to a second connection line 220 and/or a third connection line 230 (shown in FIG. 3 and FIG. 4). Referring to FIG. 3, FIG. 4, and FIG. 25, the second connection line 220 may include sections 222, which are spaced from one another in the first direction in the peripheral area PA. Each section of the second connection line 220 may be connected to the corresponding ESD protection circuit. The ESD protection circuit may be/include a bridge 250b that electrically connects the sections 222. Similarly, the third connection line 230 may include sections 232, which are spaced from one another in the first direction in the peripheral area PA. Each section of the third connection lines 230 may be connected to the corresponding ESD protection circuit. The ESD protection circuit may be/include a bridge 250c that electrically connects the sections 232.

Referring to FIGS. 26A and 26B, bridges 250b may be positioned on a layer different from a layer on which the sections 222 of the second connection line 220 are positioned, and may be electrically connected to the sections 222 of the second connection line 220 via contact holes C. A bridge 250c may be positioned on a layer different from a layer on which sections 232 of the third connection line 230 are positioned, and may be electrically connected to the sections 232 of the third connection line 230 via contact holes C.

In an embodiment, as shown in FIG. 26A, the sections 222 of the second connection line 220 and the sections 232 of the third connection line 230 may be positioned on an insulation surface 120 of the first insulating layer 320 or the second insulating layer 331 (shown in FIG. 17 or FIG. 22). The third insulating layer 332 (and the second insulating layer 331) may be substantially positioned between the second connection line 220 and the data line 171 and between the third connection line 230 and the data line 171. The data line 171 may be positioned between the third insulating layer 332 and the fourth insulating layer 341. The first connection line 210 may be positioned between the fourth insulating layer 341 and the fifth insulating layer 342. The bridges 250b and 250c may be positioned on the fifth insulating layer 342. The bridges 250b and 250c may be positioned on the same layer as the pixel electrode 410 (shown in FIG. 17 or FIG. 22). The bridge 250b may connect the sections 222 of the second connection line 220 (positioned between the bridge 250b and the substrate 100) via contact holes C. The sections 222 of the second connection line 220 may be electrically connected to the corresponding first connection line 210 (positioned between the sections 222 and the fifth insulating layer 342) via a contact hole C at the second contact part CNT2. The bridge 250c may connect the sections 232 of the third connection line 230 (positioned between the bridge 250c and the substrate 100) via contact holes C. The sections 232 of the third connection line 230 may be electrically connected to the data line 171 (positioned between the sections 232 and the fourth insulating layer 341) via a contact holes C at a third contact part CNT3. The second contact part CNT2, the third contact part CNT3, and the bridges 250b and 250c may be positioned in the peripheral area PA and may be positioned adjacent to the boundary between the display area DA and the peripheral area PA.

In an embodiment, as shown in FIG. 26B, the bridges 250b and 250c may be positioned on the third insulating layer 332. The bridges 250b and 250c may be positioned on the same layer as the data line 171. The bridge 250b may connect the sections 222 of the second connection line 220 (positioned between the bridge 250b and the substrate 100) via contact holes C. The sections 222 of the second connection line 220 may be electrically connected to the corresponding first connection line 210 via a contact hole C at the second contract part CNT2. The bridge 250c may connect the sections 232 of the third connection line 230 (positioned between the bridge 250c and the substrate 100) via contact holes C. The sections 232 of the third connection line 230 may be electrically connected to the corresponding data line 171 (positioned between the sections 232 and the fourth insulating layer 341) via a contact hole C at the third contact part CNT3. The second contact part CNT2, the third contact part CNT3, and the bridges 250b and 250c may be positioned in the peripheral area PA and positioned adjacent to the boundary between the display area DA and the peripheral area PA.

Figure 27:
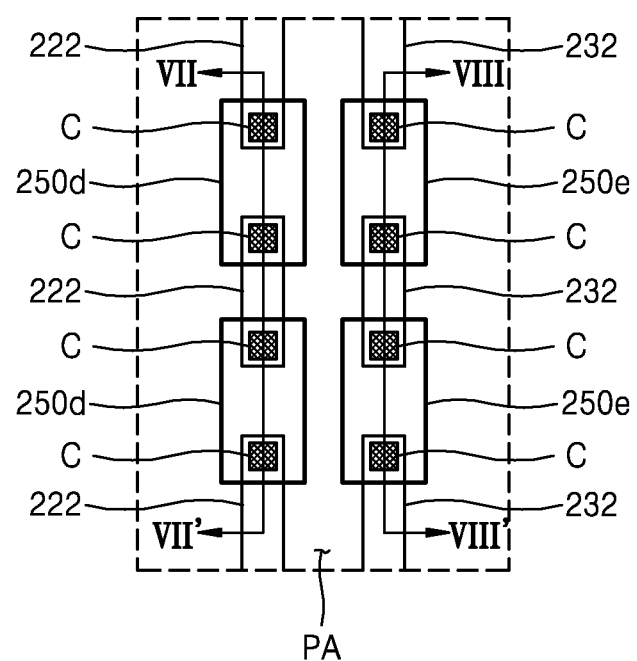
FIG. 27 is a plan view illustrating a portion D of FIG. 3 according to an embodiment.
Figure 28A:
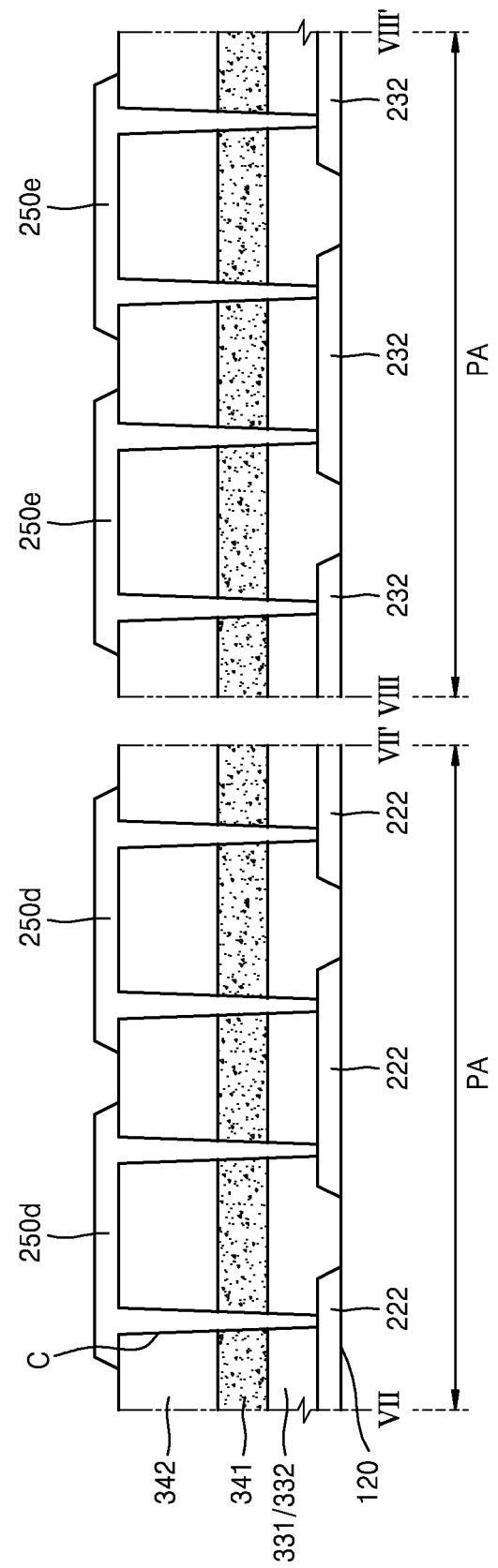
FIG. 28A is a cross-sectional view taken along lines VII-VII' and VIII-VIII' of FIG. 27 according to an embodiment.
Figure 28B:
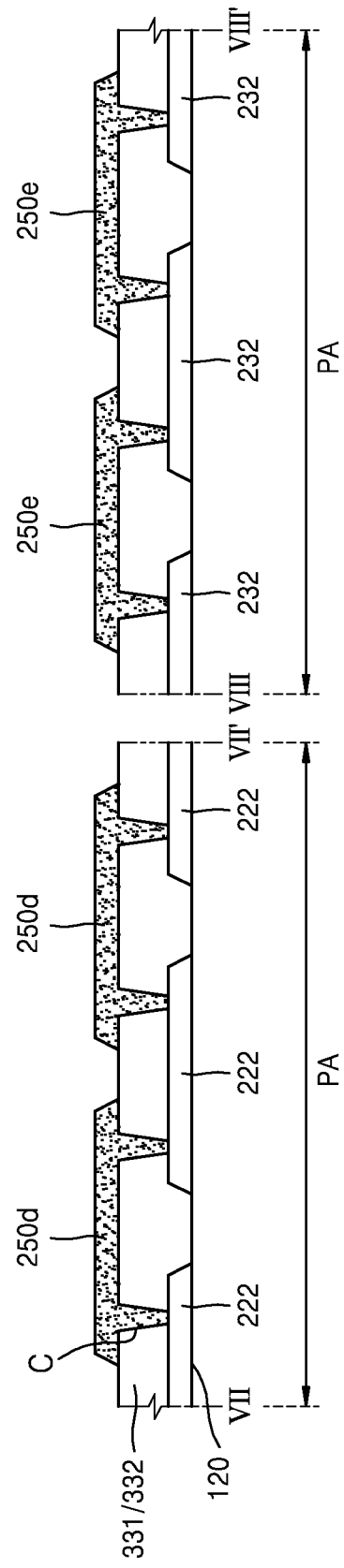
FIG. 28B is a cross-sectional view taken along the lines VII-VII' and VIII-VIII' of FIG. 27 according to an embodiment.

FIG. 27 is a plan view illustrating the portion D of FIG. 3 according to an embodiment. FIGS. 28A and 28B are cross-sectional views taken along lines VII-VII' and VIII-VIII' of FIG. 27 according to embodiments.

In an embodiment, an ESD protection circuit may be provided adjacent to the pad area PADA of the peripheral area PA and may be connected to a second connection line 220 and/or a third connection line 230 (shown in FIG. 3 and FIG. 4). Referring to FIG. 3, FIG. 4, and FIG. 27, the second connection line 220 may include sections 222, which are spaced from one another in the first direction in the peripheral area PA. Each section of the second connection line 220 may be connected to an ESD protection circuit. The ESD protection circuit may be/include bridges 250d that electrically connect the sections 222. Similarly, the third connection line 230 may include sections 232, which are spaced from one another in the first direction in the peripheral area PA. Each section of the third connection line 230 may be connected to an ESD protection circuit. The ESD protection circuit may be/include bridges 250e that electrically connect the sections 232.

Referring to FIGS. 28A and 28B, the bridge 250d may be positioned on a layer different from a layer on which the sections 222 of the second connection line 220 are positioned, and may be electrically connected to the sections 222 of the second connection line 220 via contact holes C. The bridge 250e may be positioned on a layer different from a layer on which the sections 232 of the third connection line 230 are positioned, and may be electrically connected to the sections 232 of the third connection line 230 via contact holes C.

In an embodiment, as shown in FIG. 28A, the sections 222 of the second connection line 220 and the sections 232 of the third connection line 230 may be positioned on an insulation surface 120 of the first insulating layer 320 or the second insulating layer 331 (shown in FIG. 17 or FIG. 22). The bridges 250d and 250e may be positioned on the fifth insulating layer 342. The third insulating layer 332, the fourth insulating layer 341, and the fifth insulating layer 342 (and the second insulating layer 331) may be positioned between the second connection line 220 and the bridge 250d and between the third connection line 230 and the bridge 250e. The bridges 250d and 250e may be positioned on the same layer as the pixel electrode 410. The bridges 250d may connect the sections 222 of the second connection line 220 (positioned between the bridge 250d and the substrate 100) via contact holes C. The bridge 250e may connect the sections 232 of the third connection line 230 (positioned between the bridge 250e and the substrate 100) via the contact holes C.

In an embodiment, as shown in FIG. 28B, the sections 222 of the second connection line 220 and the sections 232 of the third connection line 230 may be positioned on an insulation surface 120 of the first insulating layer 320 or the second insulating layer 331 (shown in FIG. 17 or FIG. 22). The bridges 250d and 250e may be positioned on the third insulating layer 332. The bridges 250d and 250e may be positioned on the same layer as the data line 171. The third insulating layer 332 (and the second insulating layer 331) may be positioned between the second connection line 220 and the bridges 250d and between the third connection line 230 and the bridges 250e. The bridges 250d may connect the sections 222 of the second connection line 220 (positioned between the bridges 250d and the substrate 100) via contact holes C. The bridges 250e may connect the sections 232 of the third connection line 230 (positioned between the bridges 250e and the substrate 100) via contact holes C.

Figure 29:
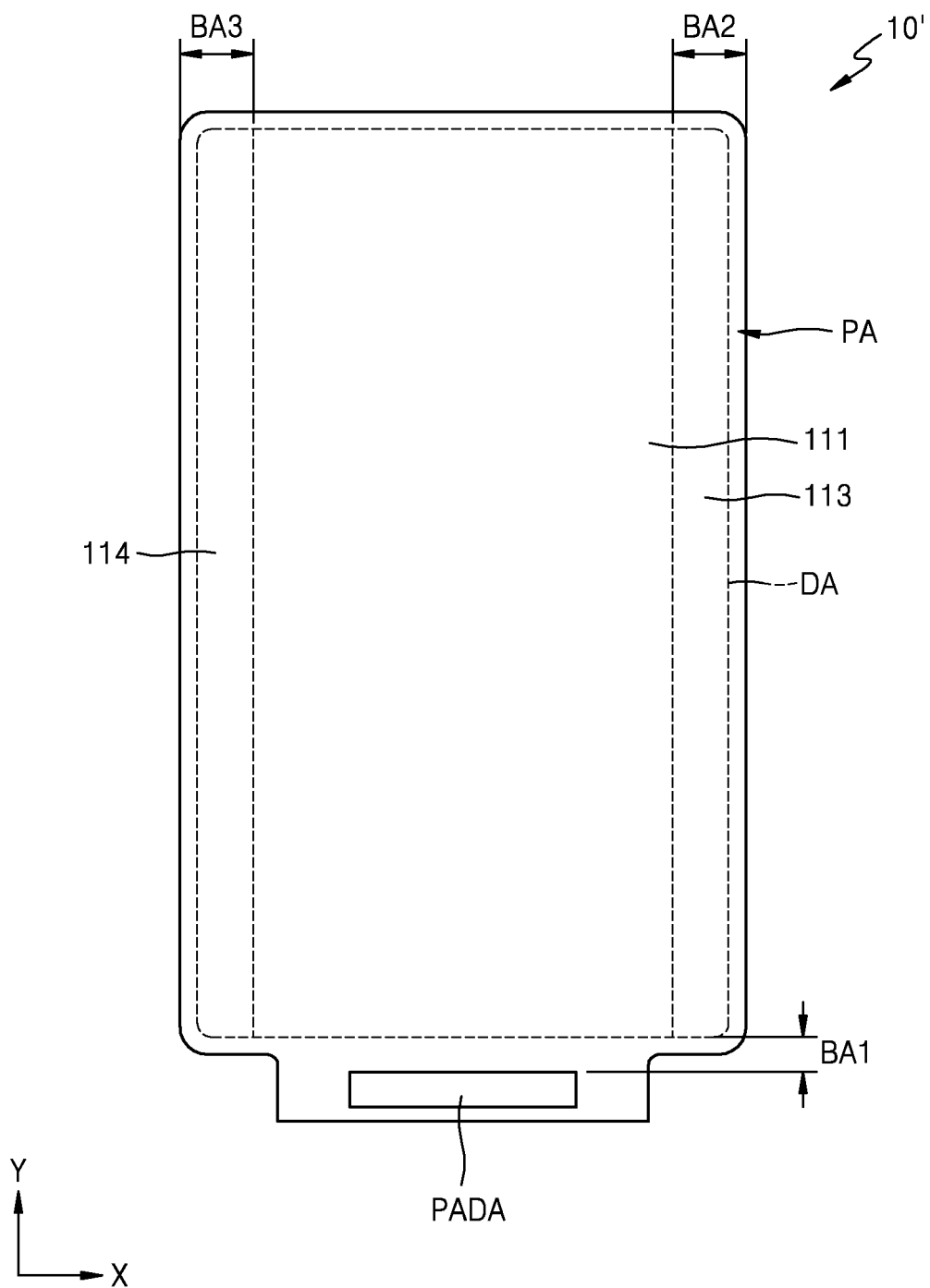
FIG. 29 is a plan view illustrating a part of a display device according to an embodiment.

FIG. 29 is a plan view illustrating a part of a display device according to an embodiment.

A display device 10' shown in FIG. 29 has first through third bending areas BA1, BA2, and BA3. The display device 10' may include features that are analogous to or identical to some of the above-described features. The third and fourth display units 113 and 114 may extend from the first display unit 111. Each of the third display unit 113 and the fourth display unit 114 may include an edge display unit and a side display unit. Analogous to features shown in FIGS. 3 and 4, a first connection line 210 may be positioned in the display area DA of the display device 10', and a second connection line 220 and a third connection line 230 may be positioned in the peripheral area PA of the first bending area BA1 of the display device 10'. The first connection line 210, the second connection line 220, and the third connection line 230 may be connected to at least one ESD protection circuit, analogous to features described above.

In embodiments, an ESD protection circuit may be connected to a connection line between a data line and a pad so that the connection line and/or the data line may be prevented from being damaged by static electricity of the connection line and/or the data line. The ESD protection circuit may be/include a bridge that electrically connects sections of the connection line. In an embodiment, an ESD protection circuit may be positioned in the display area. In an embodiment, an ESD protection circuit may be provided in a peripheral area P and may be positioned near a boundary between the display area and the peripheral area. In an embodiment, an ESD protection circuit may be provided in a peripheral area and may be positioned near a pad area.

In embodiments, a connection line for transmitting data signals to a data line is arranged within a display area of a display device, so that a non-display area of the display device may be minimized. An ESD protection circuit may be connected to the connection line, so that the connection line and/or the data line may be prevented from being damaged due to static electricity introduced from an entity outside the display device.

The described example embodiments should be considered in an illustrative sense and not for purposes of limitation. Descriptions of features or aspects within an embodiment should typically be considered as available for other embodiments. While example embodiments have been described with reference to the figures, various changes may be made to the embodiments without departing from the scope defined by the following claims.

What is claimed is:

1. A display device comprising:
a substrate comprising a display area and a peripheral area, wherein a display element is on the display area, and the peripheral area is positioned outside the display area and comprises a pad area,
a data line on the display area;
a pad on the pad area;
a connection line on the display area, positioned on a layer which is different from a layer on which the data line is positioned, electrically connected to the data line and the pad, and configured to transmit a signal from the pad to the data line; and
an electrostatic discharge protection circuit electrically connected to the connection line.

2. The display device of claim 1, wherein
the connection line comprises a first section and a second section,
the electrostatic discharge protection circuit comprises a bridge, and
the first section is spaced from the second section in an extension direction of the connection line and is electrically connected through the bridge to the second section.

3. The display device of claim 2, wherein
the display element comprises a pixel electrode and a capacitor,
the connection line is arranged between the capacitor and the pixel electrode, and
the data line is arranged between the connection line and the capacitor.

4. The display device of claim 3, wherein the bridge is on the same layer as the pixel electrode or the data line.

5. The display device of claim 2, wherein
the second section comprises an extension part, and
the extension part extends beyond the display area toward the pad area.

6. The display device of claim 5, wherein
the display element comprises a pixel electrode and a capacitor,
the connection line is arranged between the capacitor and the pixel electrode, and
the data line is arranged between the connection line and the capacitor.

7. The display device of claim 6, wherein
the bridge is on the same layer as the pixel electrode or the data line.

8. A display device comprising:
a substrate comprising a display area and a peripheral area, wherein the peripheral area is positioned outside the display area and comprises a pad area;
a data line on the display area;
a pad on the pad area;
a first connection line on the display area, positioned on a layer which is different from a layer on which the data line is positioned, and electrically connected to the data line;
a second connection line on the peripheral area and electrically connected to the first connection line and the pad; and
an electrostatic discharge protection circuit electrically connected to at least one of the first connection line and the second connection line.

9. The display device of claim 8,
further comprising a display element, wherein
the display element comprises a pixel electrode and a capacitor, the first connection line is positioned between the capacitor and the pixel electrode, and the data line is positioned between the first connection line and the capacitor.

10. The display device of claim 9, wherein the first connection line comprises a first section and a second section, the electrostatic discharge protection circuit comprises a bridge, and the first section is spaced from the second section in an extension direction of the first connection line and is electrically connected through the bridge to the second section.

11. The display device of claim 10, wherein the bridge is on the same layer as the pixel electrode.

12. The display device of claim 10, wherein the bridge is on the same layer as the data line.

13. The display device of claim 9, wherein the second connection line comprises two sections that are spaced from one another in an extension direction of the second connection line, and the electrostatic discharge protection circuit comprises a bridge that electrically connects the two sections of the second connection line to each other.

14. The display device of claim 13, wherein the bridge is on the peripheral area and is positioned between the display area and the pad area.

15. The display device of claim 13, wherein the second connection line is on the same layer as an electrode of the capacitor, the bridge is on the peripheral area, and is on the same layer as the pixel electrode.

16. The display device of claim 13, wherein the second connection line is on the same layer as an electrode of the capacitor, the bridge is on the peripheral area, and is on the same layer as the data line.

17. The display device of claim 8, wherein the first connection line comprises a first section and a second section spaced from the first section, the second section extends from the display area to the peripheral area toward the pad area, the electrostatic discharge protection circuit comprises a bridge, and the first section is arranged on the display area and is electrically connected through the bridge to the second section.

18. The display device of claim 17, wherein the bridge is on the same layer as the pixel electrode.

19. The display device of claim 17, wherein the bridge is on the same layer as the data line.

20. The display device of claim 8, wherein the first connection line comprises a first segment and a second segment, the first segment extends in a first direction, the second segment is directly connected to the first segment and extends in a second direction perpendicular to the first direction, and each of the first segment and the second segment is on the display area.

* * * * *